(12) United States Patent
Saotome et al.

(10) Patent No.: US 9,972,274 B2
(45) Date of Patent: May 15, 2018

(54) FIELD-EFFECT TRANSISTOR, DISPLAY ELEMENT, IMAGE DISPLAY DEVICE, AND SYSTEM

(71) Applicants: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP)

(72) Inventors: Ryoichi Saotome, Kanagawa (JP); Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Sadanori Arae, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 29 days.

(21) Appl. No.: 15/032,192

(22) PCT Filed: Oct. 23, 2014

(86) PCT No.: PCT/JP2014/078842
§ 371 (c)(1),
(2) Date: Apr. 26, 2016

(87) PCT Pub. No.: WO2015/064670
PCT Pub. Date: May 7, 2015

(65) Prior Publication Data
US 2016/0267873 A1 Sep. 15, 2016

(30) Foreign Application Priority Data

Oct. 30, 2013 (JP) .................................. 2013-225182
Aug. 12, 2014 (JP) .................................. 2014-164080

(51) Int. Cl.
*H01L 27/12* (2006.01)
*G09G 3/36* (2006.01)
(Continued)

(52) U.S. Cl.
CPC ......... *G09G 3/3696* (2013.01); *G09G 3/3677* (2013.01); *G09G 3/3688* (2013.01);
(Continued)

(58) Field of Classification Search
CPC ............ H01L 29/7869; H01L 27/1225; H01L 27/1248; H01L 27/3244; H01L 21/0405;
(Continued)

(56) References Cited

U.S. PATENT DOCUMENTS 9,000,443 B2 * 4/2015 Hatano ............... H01L 51/5243
257/72
2006/0244107 A1 11/2006 Sugihara et al.
(Continued)

FOREIGN PATENT DOCUMENTS

JP 2004-266057 9/2004
JP 2005-033172 2/2005
(Continued)

OTHER PUBLICATIONS

International Search Report dated Nov. 25, 2014 for counterpart International Patent Application No. PCT/JP2014/078842 filed Oct. 23, 2014.
(Continued)

Primary Examiner — Vinh T Lam
(74) Attorney, Agent, or Firm — Cooper & Dunham LLP

(57) ABSTRACT

A field-effect transistor, including: a base; a passivation layer; a gate insulating layer formed therebetween; a source electrode and a drain electrode, which are formed to be in contact with the gate insulating layer; a semiconductor layer, which is formed between at least the source electrode and
(Continued)

the drain electrode, and is in contact with the gate insulating layer, the source electrode, and the drain electrode; and a gate electrode, which is in contact with the gate insulating layer, and faces the semiconductor layer via the gate insulating layer, wherein the passivation layer contains a first passivation layer, which contains a first composite metal oxide containing Si, and an alkaline earth metal, and a second passivation layer, which is formed to be in contact with the first passivation layer, and contains a second composite metal oxide containing an alkaline earth metal, and a rare-earth element.

9 Claims, 10 Drawing Sheets

(51) Int. Cl.
*H01L 29/786* (2006.01)
*H01L 27/32* (2006.01)

(52) U.S. Cl.
CPC ...... *H01L 27/1225* (2013.01); *H01L 27/1248* (2013.01); *H01L 29/7869* (2013.01); *G09G 2300/0809* (2013.01); *G09G 2300/0842* (2013.01); *G09G 2310/0278* (2013.01); *H01L 27/3244* (2013.01)

(58) Field of Classification Search
CPC ............. H01L 21/045; H01L 21/28247; H01L 21/30655; H01L 23/3171; H01L 31/1868; H01L 51/107; H01L 51/448; H01L 2224/0348; H01L 2224/0391; H01L 2224/03916; H01L 2224/2748; H01L 2224/2791; H01L 2224/27916; G09G 3/3688; G09G 3/3677; G09G 3/3696; G09G 2310/0278; G09G 2300/0842; G09G 2300/0809
USPC .............. 345/38–39, 42–51, 55, 76–92, 105; 257/40, 43
See application file for complete search history.

(56) References Cited

U.S. PATENT DOCUMENTS

| | | |
|---|---|---|
| 2007/0052025 A1 | 3/2007 | Yabuta |
| 2008/0277663 A1 | 11/2008 | Kang et al. |
| 2010/0117075 A1 | 5/2010 | Akimoto et al. |
| 2010/0193772 A1 | 8/2010 | Morosawa et al. |
| 2010/0276688 A1 | 11/2010 | Yano et al. |
| 2011/0240988 A1 | 10/2011 | Yano et al. |
| 2012/0248451 A1 | 10/2012 | Sone et al. |
| 2013/0120702 A1* | 5/2013 | Yamazaki ............ G02F 1/1368 349/143 |
| 2013/0235003 A1* | 9/2013 | Chang ................. G09G 3/3677 345/204 |
| 2014/0009514 A1 | 1/2014 | Abe et al. |
| 2014/0217395 A1* | 8/2014 | Facchetti ............ H01L 29/7869 257/43 |
| 2015/0001474 A1* | 1/2015 | Park ..................... H01L 51/5271 257/40 |
| 2015/0001476 A1* | 1/2015 | Wang .................... H01L 27/124 257/40 |
| 2015/0076488 A1* | 3/2015 | Kishi .................. H01L 29/7869 257/43 |
| 2015/0214255 A1* | 7/2015 | Chikama .......... H01L 29/66765 257/43 |
| 2015/0214374 A1* | 7/2015 | Hara ................... H01L 27/1248 257/43 |

FOREIGN PATENT DOCUMENTS

| | | |
|---|---|---|
| JP | 3666915 | 4/2005 |
| JP | 2007-073705 | 3/2007 |
| JP | 2009-230953 | 10/2009 |
| JP | 2010-103203 | 5/2010 |
| JP | 2010-135770 | 6/2010 |
| JP | 2010-182819 | 8/2010 |
| JP | 2011-151370 | 8/2011 |
| JP | 2011-216845 | 10/2011 |
| JP | 2013-030784 | 2/2013 |
| JP | 2014-107527 | 6/2014 |
| KR | 10-2001-0039733 A | 5/2001 |
| KR | 10-2012-0096469 A | 8/2012 |
| KR | 10-2013-0032916 A | 4/2013 |
| TW | 200943552 A1 | 10/2009 |
| TW | 201249748 A1 | 12/2012 |
| WO | WO2014/084406 A1 | 6/2014 |

OTHER PUBLICATIONS

Apr. 26, 2016 Taiwanese official action (and English translation thereof) in connection with Taiwanese Patent Application No. 103137055.
Korean official action dated Jul. 27, 2017 in connection with corresponding Korean patent application No. 10-2016-7013994.

\* cited by examiner

FIELD-EFFECT TRANSISTOR, DISPLAY ELEMENT, IMAGE DISPLAY DEVICE, AND SYSTEM

TECHNICAL FIELD

The present invention relates to a field-effect transistor, a display element, an image display device, and a system.

BACKGROUND ART

A field-effect transistor (FET) is a transistor, which controls electric current between a source electrode and a drain electrode by providing a gate for a flow of electrons or holes with a channel of an electric field.

The FET has been used as a switching element, or an amplifying element, because of properties thereof. As the FET has a flat structure as well as using low gate electric current, the FET can be easily produced and integrated compared to a bipolar transistor. For these reasons, the FET is an essential part used in integrated circuit of current electric devices. The FET is applied in an active matrix display as a thin film transistor (TFT).

As a flat panel display (FPD), a liquid crystal display (LCD), an organic electroluminescent (EL) display, and electronic paper have recently been in use.

These FPDs are driven by a driving circuit containing TFT using amorphous silicon or polycrystalline silicon in an active layer. There are demands for increasing the size, improving the definition and image quality, and increasing driving speed of the FPD. To this end, there is a need of a TFT, which has high carrier mobility, a high on/off ratio, small variations in the properties thereof over time, and small variations between the elements.

However, TFTs using amorphous silicon or polycrystalline silicon for an active layer have advantages and disadvantages. It is therefore difficult to achieve all of the requirements at the same time. To respond to all of the requirements, developments of TFTs using an oxide semiconductor in an active layer, the mobility of which is expected to be higher than amorphous silicon, have been actively conducted. For example, disclosed is a TFT using InGaZnO$_4$ in a semiconductor layer (see, for example, NPL 1).

The TFT is required to have small variations in threshold voltage.

One of the factors to vary the threshold voltage of the TFT is absorption and desorption of moisture, hydrogen, or oxygen contained in the atmosphere to or from a semiconductor layer. Therefore, a passivation layer is provided to protect the semiconductor from moisture, hydrogen, or oxygen contained in the atmosphere.

Moreover, the threshold voltage is also changed by repeating on, and off of the TFT for numerous of times over a long period. As for a method for evaluating variations of threshold voltage as a result of driving for long period and numerous of time, a bias temperature stress (BTS) test has been widely carried out. This test is a method, in which voltage is applied between a gate electrode and source electrode of a field-effect transistor for a certain period, and variations in the threshold voltage during this period is evaluated, or a method, in which voltage is applied between a gate electrode and source electrode, and between a drain electrode and source electrode for a certain period, and variations in the threshold voltage during this period is evaluated.

Several passivation layers are disclosed in order to prevent variations in the threshold voltage of the TFT. For example, disclosed is a field-effect transistor using SiO$_2$, Si$_3$N$_4$, or SiON as a passivation layer (see, for example, PTL 1). It is reported that the field-effect transistor, in which this passivation layer is stably operated, without transistor characteristic of which is influenced by an atmosphere, such as vacuum, and the atmospheric air. However, the data associated with the BTS test is not disclosed therein.

Moreover, disclosed is a field-effect transistor using Al$_2$O$_3$, AlN, or AlON as a passivation layer (see, for example, PTL 2). It is reported that the field-effect transistor can suppress variations in transistor characteristics thereof by preventing incorporation of a semiconductor layer with impurities, such as moisture, and oxygen. However, the data associated with the BTS test is not disclosed therein.

Moreover, disclosed is a field-effect transistor using a laminate film containing Al$_2$O$_3$ and SiO$_2$ as a passivation layer (see, for example, PTL 3). It is reported that the field-effect transistor using this laminate film as a passivation layer can prevent incorporation and absorption of moisture into the semiconductor layer, and the transistor characteristics thereof do not change after a storing test in a high temperature-high humidity environment. However, the data associated with the BTS test is not disclosed therein.

Moreover, disclosed is a field-effect transistor using a single layer film of SiO$_2$, Ta$_2$O$_5$, TiO$_2$, HfO$_2$, ZrO$_2$, Y$_2$O$_3$, or Al$_2$O$_3$, or a laminate film thereof as a passivation layer (see, for example, PTL 4). It is reported that the field-effect transistor, in which the aforementioned passivation layer is formed, can be prevent desorption of oxygen from an oxide semiconductor, and can improve reliability. However, the data associated with the BTS test is not disclosed therein.

Furthermore, disclosed is a field-effect transistor using Al$_2$O$_3$ as a passivation layer (see, for example, NPL 2). The result of the reliability evaluation of the field-effect transistor, in which the aforementioned passivation layer is formed, performed by the BTS test is reported, but the variation value of the threshold voltage ($\Delta$Vth) is large relative to the stress time elapsed. It is therefore cannot be said that the reliability of the field-effect transistor is sufficiently secured.

In any of the aforementioned techniques, the reliability evaluation by the BTS test is not sufficient.

Accordingly, there is currently a need for a field-effect transistor, which has a small variation in a threshold voltage at the BTS test, and exhibits high reliability.

CITATION LIST

Patent Literature

PTL 1: Japanese Patent Application Laid-Open (JP-A) No. 2007-073705
PTL 2: JP-A No. 2010-135770
PTL 3: JP-A No. 2010-182819
PTL 4: JP-A No. 2010-135462

Non-Patent Literature

NPL 1: K. Nomura, and 5 others, "Room-temperature fabrication of transparent flexible thin film transistors using amorphous oxide semiconductors," NATURE, VOL. 432, 25, November, 2004, p. 488-492
NPL 2: T. Arai, and 1 other, "Manufacturing Issues for Oxide TFT Technologies for Large-Sized AMOLED Displays," SID 2012 Digest, 2012, p. 756-759

SUMMARY OF INVENTION

Technical Problem

The present invention aims to solve the aforementioned various problems in the art, and achieve the following object. Specifically, an object of the present invention is to provide a field-effect transistor, which has a small variation in threshold voltage at a bias stress temperature (BTS) test, and exhibits high reliability.

Solution to Problem

The means for solving the aforementioned problems are as follows:

The field-effect transistor of the present invention contains:

a base;

a passivation layer;

a gate insulating layer formed between the base and the passivation layer;

a source electrode and a drain electrode, which are formed to be in contact with the gate insulating layer;

a semiconductor layer, which is formed between at least the source electrode and the drain electrode, and is in contact with the gate insulating layer, the source electrode, and the drain electrode; and a gate electrode, which is in contact with the gate insulating layer, and faces the semiconductor layer via the gate insulating layer, wherein the passivation layer contains a first passivation layer, which contains a first composite metal oxide containing Si, and an alkaline earth metal, and a second passivation layer, which is formed to be in contact with the first passivation layer, and contains a second composite metal oxide containing an alkaline earth metal, and a rare-earth element.

Advantageous Effects of Invention

The present invention can solve the aforementioned various problems in the art, and can provide a field-effect transistor, which has a small variation in threshold voltage at a bias stress temperature (BTS) test, and exhibits high reliability.

DESCRIPTION OF EMBODIMENTS

Field-Effect Transistor

Figure 1:
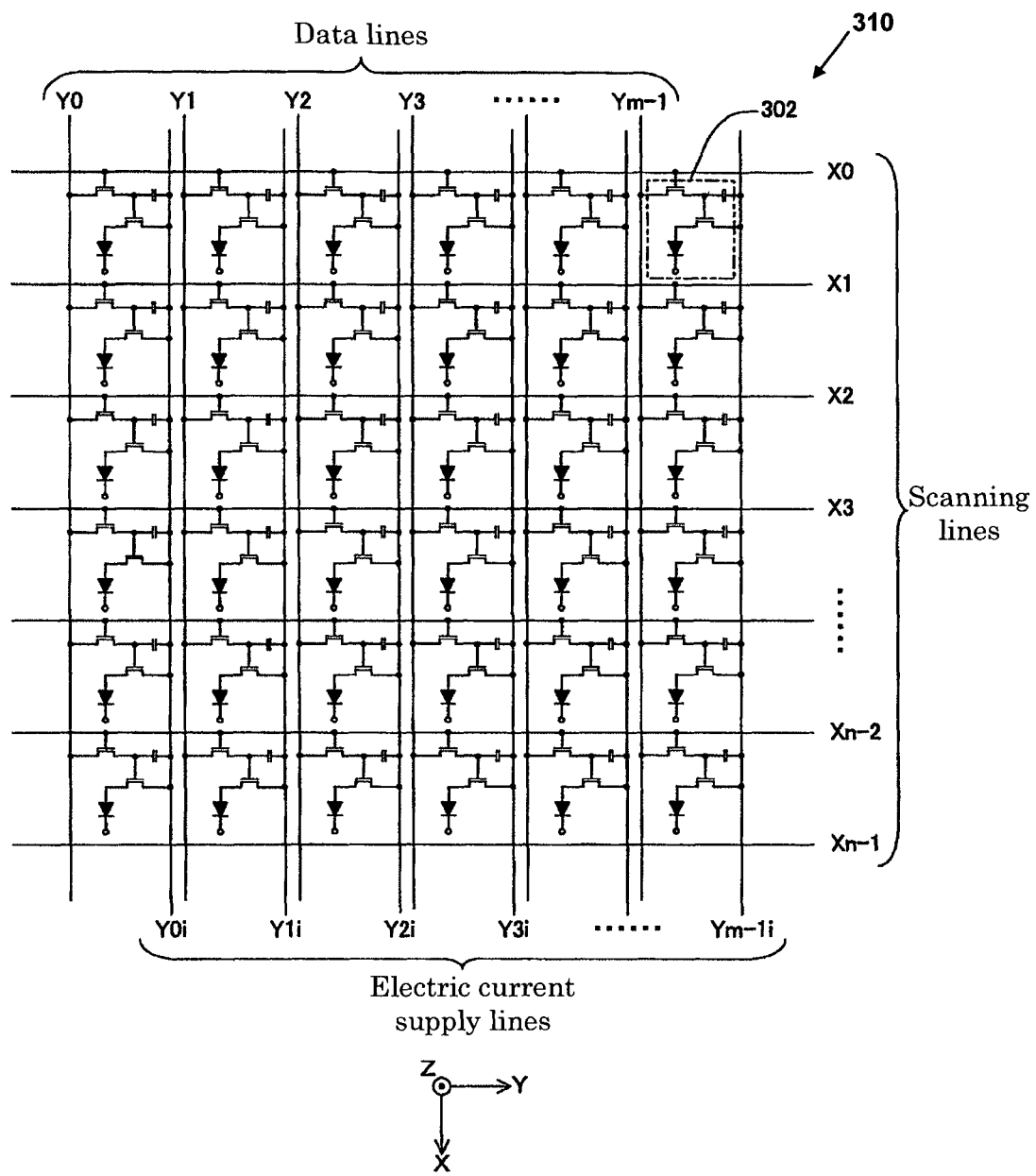
FIG. 1 is a diagram for explaining an image display device.

The field-effect transistor of the present invention contains at least a base, a passivation layer, a gate insulating layer, a source electrode, a drain electrode, a semiconductor layer, and a gate electrode, and may further contain other members according to the necessity.

<Base>

A shape, structure, and size of the base are appropriately selected depending on the intended purpose without any limitation.

A material of the base is appropriately selected depending on the intended purpose without any limitation, and examples thereof include a glass base, and a plastic base.

The glass base is appropriately selected depending on the intended purpose without any limitation, and examples thereof include non-alkali glass, and silica glass.

The plastic base is appropriately selected depending on the intended purpose without any limitation, and examples thereof include polycarbonate (PC), polyimide (PI), polyethylene terephthalate (PET), and polyethylene naphthalate (PEN).

Note that, a pre-treatment, such as a pre-treatment, such as oxygen plasma, UV ozone, and UV radiation washing, is preferably performed on the base to clean a surface thereof and to improve adhesion with another layer.

<Passivation Layer>

The passivation layer is typically formed above the base.

The passivation layer contains a first passivation layer, and a second passivation layer formed in contact with the first passivation layer.

An arrangement of the first passivation layer and the second passivation layer in the passivation layer is appropriately selected depending on the intended purpose without any limitation. The first passivation layer may be arranged at the side of the base relative to the second passivation layer.

Alternatively, the second passivation layer may be arranged at the side of the base relative to the first passivation layer. Moreover, the second passivation layer may be arranged to cover a top surface and side surface of the first passivation layer. The first passivation layer may be arranged to cover a top surface and side surface of the second passivation layer.

—First Passivation Layer—

The first passivation layer contains a first composite metal oxide.

The first passivation layer is preferably formed of the first composite metal oxide per se.

—First Composite Metal Oxide—

The first composite metal oxide contains Si (silicon) and an alkaline earth metal, preferably further contains Al (aluminum), or B (boron), or the both, and may further contain other components according to the necessity.

In the first composite metal oxide, $SiO_2$ formed with the aforementioned Si takes an amorphous structure. Moreover, the alkaline earth metal has a function of cutting a Si—O bond. Therefore, the dielectric constant and linear expansion coefficient of the first composite metal oxide to be formed can be controlled with a composition ratio of the Si and the alkaline earth metal.

The first composite metal oxide preferably contains Al, or B, or the both. $Al_2O_3$ formed with the Al, and $B_2O_3$ formed with the B each form an amorphous structure, similarly to $SiO_2$. Therefore, an amorphous structure is more stably formed in the first composite metal oxide, and it is possible to form a more uniform insulating film. Since the alkaline earth metal changes the coordinate structure of Al and B depending on the composition ratio therefore, a dielectric constant and linear expansion coefficient of the first composite metal oxide can be controlled.

Examples of the alkaline earth metal in the first composite metal oxide include Be (beryllium), Mg (magnesium), Ca (calcium), Sr (strontium), and Ba (barium). They may be used alone, or in combination.

A composition ratio of the Si and the alkaline earth metal in the first composite metal oxide is appropriately selected depending on the intended purpose without any limitation, but the composition ratio thereof is preferably within the following range.

In the first composite metal oxide, the composition ratio of the Si and the alkaline earth metal (the Si:the alkaline earth metal) is preferably 50.0 mol % to 90.0 mol %:10.0 mol % to 50.0 mol %, based on the oxide ($SiO_2$, BeO, MgO, CaO, SrO, BaO) conversion.

A composition ratio of the Si, the alkaline earth metal, and the Al and/or the B in the first composite metal oxide is appropriately selected depending on the intended purpose without any limitation, but the composition ratio thereof is preferably within the following range.

In the first composite metal oxide, the composition ratio of the Si, the alkaline earth metal, and the Al and/or the B (the Si the alkaline earth metal:the Al and/or the B) is preferably 50.0 mol % to 90.0 mol %:5.0 mol % to 20.0 mol %:5.0 mol % to 30.0 mol %, based on the oxide ($SiO_2$, BeO, MgO, CaO, SrO, BaO, $Al_2O_3$, $B_2O_3$) conversion.

The proportion of the oxide ($SiO_2$, BeO, MgO, CaO, SrO, BaO, $Al_2O_3$, $B_2O_3$) in the first composite metal oxide can be calculated, for example, by analyzing a cationic element of the oxide through X-ray fluorescence spectrometry, electron probe microanalysis (EPMA), or inductively coupled plasma atomic emission spectroscopy (ICP-AES).

The dielectric constant of the first passivation layer is appropriately selected depending on the intended purpose without any limitation.

The dielectric constant can be measured, for example, by producing a capacitor, in which a lower electrode, a dielectric layer (the passivation layer), and an upper electrode are laminated, and measuring using an LCR meter.

The linear expansion coefficient of the first passivation layer is appropriately selected depending on the intended purpose without any limitation.

The linear expansion coefficient can be measured, for example, by a thermomechanical analysis device. In this measurement, the linear expansion coefficient can be measured by separately producing a measurement sample having the same composition to that of the passivation layer, without producing the field-effect transistor.

—Second Passivation Layer—

The second passivation layer contains a second composite metal oxide.

The second passivation layer is preferably formed of the second composite metal oxide per se.

—Second Composite Metal Oxide—

The second composite metal oxide contains at least an alkaline earth metal, and a rare-earth element, preferably contains Zr (zirconium), or Hf (hafnium), or both thereof, and may further contain other components according to the necessity.

The second composite metal oxide is stable in the atmosphere, and can stably form an amorphous structure with a wide range of the composition. This is because the present inventors have found that a composite metal oxide containing an alkaline earth metal and a rare-earth element is stable in the atmosphere, and can stably form an amorphous structure with a wide range of the composition.

Typically, a simple oxide of an alkaline earth metal tends to react with moisture or carbon dioxide in the atmosphere to form hydroxide or carbonate, and therefore such the simple oxide is not suitable for use in an electronic device. Moreover, a simple oxide of a rare-earth element tends to be crystallized, and causes leak of electric current when it is used in an electronic device. However, the present inventors have found that the second composite metal oxide containing an alkaline earth metal and a rare-earth element stably form an amorphous film with a wide range of the composition. Since the second composite metal oxide is stably present with a wide range of the composition thereof, a dielectric constant and linear expansion coefficient of the second composite metal oxide to be formed can be controlled extensively depending on the composition ratio thereof. The second composite metal oxide preferably contains Zr (zirconium), or Hf (hafnium), or the both. As the second composite metal oxide contains the Zr, or the Hf, or the both, thermal stability, heat resistance, and compactness can be improved even further.

Examples of the alkaline earth metal in the second composite metal oxide include Be (beryllium), Mg (magnesium), Ca (calcium), Sr (strontium), and Ba (barium). They may be used alone, or in combination.

Examples of the rare-earth element in the second composite metal oxide include Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

A composition ratio of the alkaline earth metal and the rare-earth element in the second composite metal oxide is appropriately selected depending on the intended purpose without any limitation, but the composition ratio thereof is preferably within the following range.

In the second composite metal oxide, the composition ratio of the alkaline earth metal and the rare-earth element (the alkaline earth metal:the rare-earth element) is preferably 10.0 mol % to 67.0 mol %:33.0 mol % to 90.0 mol %, based on the oxide (BeO, MgO, CaO, SrO, BaO, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$) conversion.

A composition ratio of the alkaline earth metal, the rare-earth element, and the Zr and/or the Hf in the second composite metal oxide is appropriately selected depending on the intended purpose without any limitation, but the composition ratio thereof is preferably within the following range.

In the second composite metal oxide, the composition ratio of the alkaline earth metal, the rare-earth element, and the Zr and/or the Hf (the alkaline earth metal:the rare-earth element the Zr and/or the Hf) is preferably 5.0 mol % to 22.0 mol %:33.0 mol % to 90.0 mol %:5.0 mol % to 45.0 mol % based on the oxide (BeO, MgO, CaO, SrO, BaO, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ZrO_2$, $HfO_2$) conversion.

The proportion of the oxide (BeO, MgO, CaO, SrO, BaO, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $H_2O_3$, $Er_2O_3$, $Tm_2O_3$, $Yb_2O_3$, $Lu_2O_3$, $ZrO_2$, $HfO_2$) in the second composite metal oxide can be calculated, for example, by analyzing a cationic element of the oxide through X-ray fluorescence spectrometry, electron probe microanalysis (EPMA), or inductively coupled plasma atomic emission spectroscopy (ICP-AES).

The dielectric constant of the second passivation layer is appropriately selected depending on the intended purpose without any limitation.

The dielectric constant of the second passivation layer can be measured, for example, by the same method to the measuring method of the dielectric constant of the first passivation layer.

The linear expansion coefficient of the second passivation layer is appropriately selected depending on the intended purpose without any limitation.

The linear expansion coefficient of the second passivation layer can be measured, for example, by the same method to the measuring method of the linear expansion coefficient of the first passivation layer.

In the present invention, the present inventors have found that the passivation layer formed by laminating the first passivation layer containing the first composite metal oxide and the second passivation layer containing the second composite metal oxide exhibits excellent barrier properties against moisture, oxygen, and hydrogen in the atmosphere.

Therefore, a field-effect transistor exhibiting high reliability can be provided by using the aforementioned passivation layer.

—Formation Methods of First Passivation Layer, and Second Passivation Layer—

The formation methods of the first passivation layer, and the second passivation layer are appropriately selected depending on the intended purpose without any limitation, and examples thereof include a method, in which a film is formed by a vacuum process, such as sputtering, pulsed laser deposition (PLD), chemical vapor deposition (CVD), and atomic layer deposition (ALD), followed by patterning the film through photolithography.

Moreover, the first passivation layer can be formed by preparing a coating liquid containing a precursor of the first composite metal oxide (a first passivation layer coating liquid), applying or printing the coating liquid onto a base to be coated, and baking the resultant under appropriate conditions. Similarly, the second passivation layer can be formed by preparing a coating liquid containing a precursor of the second composite metal oxide (second passivation layer coating liquid), applying or printing the coating liquid onto a base to be coated, and baking the resultant under appropriate conditions.

The average film thickness of the first passivation layer is preferably 10 nm to 1,000 nm, more preferably 20 nm to 500 nm.

The average film thickness of the second passivation layer is preferably 10 nm to 1,000 nm, more preferably 20 nm to 500 nm.

—First Passivation Layer Coating Liquid (First Insulating Film Coating Liquid)—

The first passivation layer coating liquid (first insulating film coating liquid) contains at least a silicon-containing compound, an alkaline earth metal compound, and a solvent, preferably further contains an aluminum-containing compound, or a boron-containing compound, or the both, and may further contain other components according to the necessity.

Recently, developments of printed electronics using a coating process, which can reduce a cost, have been actively conducted, over a vacuum process, which requires expensive equipments, such as sputtering, CVD, and dry etching. Related to a passivation layer of a semiconductor, reported is a study for forming a passivation layer by coating polysilazane (see, for example, JP-A No. 2010-103203), and spin-on-glass.

However, in order to attain a fine insulating film through decomposition of organic materials, a coating liquid containing $SiO_2$, such as polysilazane, and spin-on-glass, it is necessary to perform baking at 450° C. or higher. In order to decompose an organic material at the temperature equal to or lower than 450° C., combined use of another reaction acceleration process than heating, such as a microwave treatment (see, for example, JP-A No. 2010-103203), use of a catalyst, and baking in a water vapor atmosphere (for example, see Japanese Patent (JP-B) No. 3666915) is necessary. Therefore, complication of a baking process, high cost, and reduction in insulating properties due to impurity residues are problems. On the other hand, as the first passivation layer coating liquid contains a precursor of an alkaline earth metal oxide, the decomposition temperature of which is lower than that of the $SiO_2$ precursor, it is possible to decompose the precursor at temperature lower than that for a coating liquid composed only of the $SiO_2$ precursor, i.e., the temperature lower than 450° C., and to form a fine insulating film. As an $Al_2O_3$ precursor, or a $B_2O_3$ precursor, or both, the decomposition temperature of which are lower than that of the $SiO_2$ precursor, similarly to the alkaline earth metal oxide precursor, are further contained, moreover, an effect of forming a fine insulating film at low temperature can be enhanced.

—Silicon-Containing Compound—

Examples of the silicon-containing compound include an inorganic silicon compound, and an organic silicon compound.

Examples of the inorganic silicon compound include tetrachrolosilane, tetrabromosilane, and tetraiodosilane.

The organic silicon compound is appropriately selected depending on the intended purpose without any limitation, provided that it is a compound containing silicon and an organic group. The silicon and the organic group are bonded together, for example, by an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, and a phenyl group that may have a substituent. Examples of the alkyl group include a C1-C6 alkyl group. Examples of the alkoxy group include a C1-C6 alkoxy group. Examples of the acyloxy group include a C1-C10 acyloxy group.

Examples of the organic silicon compound include tetramethoxysilane, tetraethoxysilane, tetraisopropoxysilane, tetrabutoxysilane, 1,1,1,3,3,3-hexamethyldisilazane (HMDS), bis(trimethylsilyl)acetylene, triphenylsilane, silicon 2-ethylhexanoate, and tetraacetoxysilane.

An amount of the silicon-containing compound in the first passivation layer coating liquid is appropriately selected depending on the intended purpose without any limitation.

—Alkaline Earth Metal-Containing Compound—

Examples of the alkaline earth metal-containing compound include an inorganic alkaline earth metal compound, and an organic alkaline earth metal compound. Examples of an alkaline earth metal in the alkaline earth metal-containing compound include Be (beryllium), Mg (magnesium), Ca (calcium), Sr (strontium), and Ba (barium).

Examples of the inorganic alkaline earth metal compound include alkaline earth metal nitric acid salt, alkaline earth metal sulfuric acid salt, alkaline earth metal chloride, alkaline earth metal fluoride, alkaline earth metal bromide, and alkaline earth metal iodide.

Examples of the alkaline earth metal nitric acid salt include magnesium nitrate, calcium nitrate, strontium nitrate, and barium nitrate.

Examples of the alkaline earth metal sulfuric acid salt include magnesium sulfate, calcium sulfate, strontium sulfate, and barium sulfate.

Examples of the alkaline earth metal chloride include magnesium chloride, calcium chloride, strontium chloride, and barium chloride.

Examples of the alkaline earth metal fluoride include magnesium fluoride, calcium fluoride, strontium fluoride, and barium fluoride.

Examples of the alkaline earth metal bromide include magnesium bromide, calcium bromide, strontium bromide, and barium bromide.

Examples of the alkaline earth metal iodide include magnesium iodide, calcium iodide, strontium iodide, and barium iodide.

The organic alkaline earth metal compound is appropriately selected depending on the intended purpose without any limitation, provided that it is a compound containing an alkaline earth metal and an organic group. The alkaline earth metal and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, a phenyl group that may have a substituent, an acetyl acetonate group that may have a substituent, and a sulfonic acid group that may have a substituent. Examples of the alkyl group include a C1-C6 alkyl group. Examples of the alkoxy group include a C1-C6 alkoxy group. Examples of the acyloxy group include: a C1-C10 acyloxy group; an acyloxy group part of which is substituted with a benzene ring, such as benzoic acid; an acyloxy group part of which is substituted with a hydroxyl group, such as lactic acid; and an acyloxy group containing two or more carbonyl groups, such as oxalic acid, and citric acid.

Examples of the organic alkaline earth metal compound include magnesium methoxide, magnesium ethoxide, diethyl magnesium, magnesium acetate, magnesium formate, magnesium acetylacetonate, magnesium 2-ethylhexanoate, magnesium lactate, magnesium naphthenate, magnesium citrate, magnesium salicylate, magnesium benzoate, magnesium oxalate, magnesium trifluromethane-sulfonate, calcium methoxide, calcium ethoxide, calcium acetate, calcium formate, calcium acetylacetonate, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, strontium acetylacetonate, strontium 2-ethylhexanoate, strontium lactate, strontium naphthenate, strontium salicylate, strontium oxalate, barium ethoxide, barium isopropoxide, barium acetate, barium formate, barium acetylacetonate, barium 2-ethylhexanoate, barium lactate, barium naphthenate, barium neodecanoate, barium oxalate, barium benzoate, and barium trifluoromethane-sulfonate.

An amount of the alkaline earth metal-containing compound in the first passivation layer coating liquid is appropriately selected depending on the intended purpose without any limitation.

—Aluminum-Containing Compound—

Examples of the aluminum-containing compound include an inorganic aluminum compound, and an organic aluminum compound.

Examples of the inorganic aluminum compound include aluminum chloride, aluminum nitrate, aluminum bromide, aluminum hydroxide, aluminum borate, aluminum trifluoride, aluminum iodide, aluminum sulfate, aluminum phosphate, and ammonium aluminum sulfate.

The organic aluminum compound is appropriately selected depending on the intended purpose without any limitation, provided that it is a compound containing aluminum and an organic group. The aluminum and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, an acetylacetonate group that may have a substituent, and a sulfonic acid group that may have a substituent. Examples of the alkyl group include a C1-C6 alkyl group. Examples of the alkoxy group include a C1-C6 alkoxy group. Examples of the acyloxy group include: a C1-C10 acyloxy group; an acyloxy group part of which is substituted with a benzene ring, such as benzoic acid; an acyloxy group part of which is substituted with a hydroxyl group, such as lactic acid; and an acyloxy group containing two or more carbonyl groups, such as oxalic acid, and citric acid.

Examples of the organic aluminum compound include aluminum isopropoxide, aluminum-sec-butoxide, triethyl aluminum, diethyl aluminum ethoxide, aluminum acetate, aluminum acetylacetonate, aluminum hexafluoroacetylacetonate, aluminum 2-ethylhexanoate, aluminum lactate, aluminum benzoate, aluminum di(s-butoxide) acetoacetate chelate, and aluminum trifluromethane-sulfonate.

An amount of the aluminum-containing compound in the first passivation layer coating liquid is appropriately selected depending on the intended purpose without any limitation.

—Boron-Containing Compound—

Examples of the boron-containing compound include an inorganic boron compound, and an organic boron compound.

Examples of the inorganic boron compound include orthoboric acid, boron oxide, boron tribromide, tetrafluoroboric acid, ammonium borate, and magnesium borate. Examples of the boron oxide include diboron dioxide, diboron trioxide, tetraboron trioxide, and tetraboron pentaoxide.

The organic boron compound is appropriately selected depending on the intended purpose without any limitation, provided that it is a compound containing boron and an organic group. The boron and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, a phenyl group that may have a substituent, a sulfonic acid group that may have a substituent, and a thiophene group that may have a substituent. Examples of the alkyl group include a C1-C6 alkyl group. Examples of the alkoxy group include a C1-C6 alkoxy group. The term "alkoxy group" includes an organic group, which contains two or more oxygen atoms, and two oxygen atoms out of all the oxygen atoms are bonded to boron to form a cyclic structure together with the boron. Moreover, the alkoxy group includes an alkoxy group, in which an alkyl group contained therein is substituted with an organic silyl group. Examples of the acyloxy group include a C1-C10 acyloxy group.

Examples of the organic boron compound include (R)-5,5-diphenyl-2-methyl-3,4-propano-1,3,2-oxaborolidine, triisopropyl borate, 2-isopropoxy-4,4,5,5-tetramethyl-1,3,2-dioxaborolane, bis(hexyleneglycolato)diboron, 4-(4,4,5,5-tetramethyl-1,3,2-dioxaborolan-2-yl)-1H-pyrazole, (4,4,5,5-tetramethyl-1,3,2-dioxaborolan-2-yl)benzene, tert-butyl-N-[4-(4,4,5,5-tetramethyl-1,2,3-dioxaborolan-2-yl)phenyl] carbamate, phenylboronic acid, 3-acetylphenylboronic acid, a boron trifluoride acetic acid complex, a boron trifluoride sulfolane complex, 2-thiopheneboronic acid, and tris(trimethylsilyl)botate.

An amount of the boron-containing compound in the first passivation layer coating liquid is appropriately selected depending on the intended purpose without any limitation.

—Solvent—

The solvent is appropriately selected depending on the intended purpose without any limitation, provided that it is a solvent capable of stably dissolving or dispersing the aforementioned various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethyl hexanoate, mineral spirits, dimethylpropylene urea, 4-butyrolactone, 2-methoxy ethanol, and water.

An amount of the solvent in the first passivation layer coating liquid is appropriately selected depending on the intended purpose without any limitation.

A composition ratio of the silicon-containing compound and the alkaline earth metal-containing compound (the silicon-containing compound:the alkaline earth metal-containing compound) in the first passivation layer coating liquid is appropriately selected depending on the intended purpose without any limitation, but the composition ratio thereof is preferably within the following range.

In the first passivation layer coating liquid, the composition ratio of the Si and the alkaline earth metal (the Si the alkaline earth metal) is preferably 50.0 mol % to 90.0 mol % 10.0 mol % to 50.0 mol %, based on the oxide ($SiO_2$, BeO, MgO, CaO, SrO, BaO) conversion.

A composition ratio of the silicon-containing compound, the alkaline earth metal-containing compound, and the aluminum-containing compound and/or the boron-containing compound (the silicon-containing compound:the alkaline earth metal-containing compound:the aluminum-containing compound and/or the boron-containing compound) in the first passivation layer coating liquid is appropriately selected depending on the intended purpose without any limitation, but the composition ratio thereof is preferably within the following range.

In the first passivation layer coating liquid, the composition ratio of the Si, the alkaline earth metal, and the Al and/or the B (the Si:the alkaline earth metal:the Al and/or the B) is preferably 50.0 mol % to 90.0 mol %:5.0 mol % to 20.0 mol %:5.0 mol % to 30.0 mol %, based on the oxide ($SiO_2$, BeO, MgO, CaO, SrO, BaO, $Al_2O_3$, $B_2O_3$) conversion.

—Second Passivation Layer Coating Liquid (Second Insulating Film Coating Liquid)—

The second passivation layer coating liquid (second insulating film coating liquid) contains at least an alkaline earth metal-containing compound, a rare-earth element-containing compound, and a solvent, preferably further contains a zirconium-containing compound, or a hafnium-containing compound, or the both, and may further contain other components according to the necessity.

—Alkaline Earth Metal-Containing Compound—

Examples of the alkaline earth metal-containing compound include an inorganic alkaline earth metal compound, and an organic alkaline earth metal compound. Examples of an alkaline earth metal in the alkaline earth metal-containing compound include Be (beryllium), Mg (magnesium), Ca (calcium), Sr (strontium), and Ba (barium).

Examples of the inorganic alkaline earth metal compound include alkaline earth metal nitric acid salt, alkaline earth metal sulfuric acid salt, alkaline earth metal chloride, alkaline earth metal fluoride, alkaline earth metal bromide, and alkaline earth metal iodide.

Examples of the alkaline earth metal nitric acid salt include magnesium nitrate, calcium nitrate, strontium nitrate, and barium nitrate.

Examples of the alkaline earth metal sulfuric acid salt include magnesium sulfate, calcium sulfate, strontium sulfate, and barium sulfate.

Examples of the alkaline earth metal chloride include magnesium chloride, calcium chloride, strontium chloride, and barium chloride.

Examples of the alkaline earth metal fluoride include magnesium fluoride, calcium fluoride, strontium fluoride, and barium fluoride.

Examples of the alkaline earth metal bromide include magnesium bromide, calcium bromide, strontium bromide, and barium bromide.

Examples of the alkaline earth metal iodide include magnesium iodide, calcium iodide, strontium iodide, and barium iodide.

The organic alkaline earth metal compound is appropriately selected depending on the intended purpose without any limitation, provided that it is a compound containing an alkaline earth metal and an organic group. The alkaline earth metal and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, a phenyl group that may have a substituent, an acetyl acetonate group that may have a substituent, and a sulfonic acid group that may have a substituent. Examples of the alkyl group include a C1-C6 alkyl group. Examples of the alkoxy group include a C1-C6 alkoxy group. Examples of the acyloxy group include: a C1-C10 acyloxy group; an acyloxy group part of which is substituted with a benzene ring, such as benzoic acid; an acyloxy group part of which is substituted with a hydroxyl group, such as lactic acid; and an acyloxy group containing two or more carbonyl groups, such as oxalic acid, and citric acid.

Examples of the organic alkaline earth metal compound include magnesium methoxide, magnesium ethoxide, diethyl magnesium, magnesium acetate, magnesium formate, magnesium acetylacetonate, magnesium 2-ethylhexanoate, magnesium lactate, magnesium naphthenate, magnesium citrate, magnesium salicylate, magnesium benzoate, magnesium oxalate, magnesium trifluoromethane-sulfonate, calcium methoxide, calcium ethoxide, calcium acetate, calcium formate, calcium acetylacetonate, calcium dipivaloyl methanate, calcium 2-ethylhexanoate, calcium lactate, calcium naphthenate, calcium citrate, calcium salicylate, calcium neodecanoate, calcium benzoate, calcium oxalate, strontium isopropoxide, strontium acetate, strontium formate, strontium acetylacetonate, strontium 2-ethylhexanoate, strontium lactate, strontium naphthenate, strontium salicylate, strontium oxalate, barium ethoxide, barium isopropoxide, barium acetate, barium formate, barium acetylacetonate, barium 2-ethylhexanoate, barium lactate, barium naphthenate, barium neodecanoate, barium oxalate, barium benzoate, and barium trifluoromethane-sulfonate.

An amount of the alkaline earth metal-containing compound in the second passivation layer coating liquid is appropriately selected depending on the intended purpose without any limitation.

—Rare-Earth Element-Containing Compound—

Examples of a rare-earth element in the rare-earth element-containing compound include Sc (scandium), Y (yttrium), La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (erbium), Tm (thulium), Yb (ytterbium), and Lu (lutetium).

Examples of the rare-earth element-containing compound include an inorganic rare-earth element compound, and an organic rare-earth element compound.

Examples of the inorganic rare-earth element compound include rare-earth element nitric acid salt, rare-earth element sulfuric acid salt, rare-earth element fluoride, rare-earth element chloride, rare-earth element bromide, and rare-earth element iodide.

Examples of the rare-earth element nitric acid salt include scandium nitrate, yttrium nitrate, lanthanum nitrate, cerium nitrate, praseodymium nitrate, neodymium nitrate, samarium nitrate, europium nitrate, gadolinium nitrate, terbium nitrate, dysprosium nitrate, holmium nitrate, erbium nitrate, thulium nitrate, ytterbium nitrate, and lutetium nitrate.

Examples of the rare-earth element sulfuric acid salt include scandium sulfate, yttrium sulfate, lanthanum sulfate, erium sulfate, praseodymium sulfate, neodymium sulfate, samarium sulfate, europium sulfate, gadolinium sulfate, terbium sulfate, dysprosium sulfate, holmium sulfate, erbium sulfate, thulium sulfate, ytterbium sulfate, and lutetium sulfate.

Examples of the rare-earth element fluoride include scandium fluoride, yttrium fluoride, lanthanum fluoride, cerium fluoride, praseodymium fluoride, neodymium fluoride, samarium fluoride, europium fluoride, gadolinium fluoride, terbium fluoride, dysprosium fluoride, holmium fluoride, erbium fluoride, thulium fluoride, ytterbium fluoride, and lutetium fluoride.

Examples of the rare-earth element chloride include scandium chloride, yttrium chloride, lanthanum chloride, cerium chloride, praseodymium chloride, neodymium chloride, samarium chloride, europium chloride, gadolinium chloride, terbium chloride, dysprosium chloride, holmium chloride, erbium chloride, thulium chloride, ytterbium chloride, and lutetium chloride.

Examples of the rare-earth element bromide include scandium bromide, yttrium bromide, lanthanum bromide, praseodymium bromide, neodymium bromide, samarium bromide, europium bromide, gadolinium bromide, terbium bromide, dysprosium bromide, holmium bromide, erbium bromide, thulium bromide, ytterbium bromide, and lutetium bromide.

Examples of the rare-earth element iodide include scandium iodide, yttrium iodide, lanthanum iodide, cerium iodide, praseodymium iodide, neodymium iodide, samarium iodide, europium iodide, gadolinium iodide, terbium iodide, dysprosium iodide, holmium iodide, erbium iodide, thulium iodide, ytterbium iodide, and lutetium iodide.

The organic rare-earth element compound is appropriately selected depending on the intended purpose without any limitation, provided that it is a compound containing a rare-earth element and an organic group. The rare-earth element and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, an acetyl acetonate group that may have a substituent, and a cyclopentadienyl group that may have a substituent. Examples of the alkyl group include a C1-C6 alkyl group. Examples of the alkoxy group include a C1-C6 alkoxy group. Examples of the acyloxy group include a C1-C10 acyloxy group.

Examples of the organic rare-earth element compound include scandium isopropoxide, scandium acetate, tris(cyclopentadienyl)scandium, yttrium isopropoxide, yttrium 2-ethylhexanoate, tris(acetylacetonato)yttrium, tris(cyclopentadienyl)yttrium, lanthanum isopropoxide, lanthanum 2-ethylhexanoate, tris(acetylacetonato)lanthanum, tris(cyclopentadienyl)lanthanum, cerium 2-ethylhexanoate, tris(acetylacetonato)cerium, tris(cyclopentadienyl)cerium, praseodymium isopropoxide, oxalic acidpraseodymium, tris(acetylacetonato)praseodymium, tris(cyclopentadienyl)praseodymium, neodymium isopropoxide, neodymium 2-ethylhexanoate, neodymium trifluoroacetylacetonate, tris(isopropylcyclopentadienyl)neodymium, tris(ethylcyclopentadienyl)promethium, samarium isopropoxide, samarium 2-ethylhexanoate, tris(acetylacetonato)samarium, tris(cyclopentadienyl)samarium, europium 2-ethylhexanoate, tris(acetylacetonato)europium, tris(ethylcyclopentadienyl)europium, gadolinium isopropoxide, gadolinium 2-ethylhexanoate, tris(acetylacetonato)gadolinium, tris (cyclopentadienyl)gadolinium, terbium acetate, tris (acetylacetonato)terbium, tris(cyclopentadienyl)terbium, dysprosium isopropoxide, dysprosium acetate, tris(acetylacetonato) dysprosium, tris(ethylcyclopentadienyl) dysprosium, holmium isopropoxide, holmium acetate, tris(cyclopentadienyl)holmium, erbium isopropoxide, erbium acetate, tris(acetylacetonato)erbium, tris(cyclopentadienyl)erbium, thulium acetate, tris(acetylacetonato)thulium, tris(cyclopentadienyl)thulium, ytterbium isopropoxide, ytterbium acetate, tris(acetylacetonato)ytterbium, tris(cyclopentadienyl)ytterbium, lutetium oxalate, and tris(ethylcyclopentadienyl)lutetium.

An amount of the rare-earth element-containing compound in the second passivation layer coating liquid is appropriately selected depending on the intended purpose without any limitation.

—Zirconium-Containing Compound—

Examples of the zirconium-containing compound include an inorganic zirconium compound, and an organic zirconium compound.

Examples of the inorganic zirconium compound include zirconium fluoride, zirconium chloride, zirconium bromide, zirconium iodide, zirconium carbonate, and zirconium sulfate.

The organic zirconium compound is appropriately selected depending on the intended purpose without any limitation, provided that it is a compound containing zirconium and an organic group. The zirconium and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, an acetylacetonate group that may have a substituent, and a cyclopentadienyl group that may have a substituent. Examples of the alkyl group include a C1-C6 alkyl group. Examples of the alkoxy group include a C1-C6 alkoxy group. Examples of the acyloxy group include a C1-C10 acyloxy group.

Examples of the organic zirconium compound include zirconium butoxide, zirconium isopropoxide, zirconium (2-ethylhexanoate) oxide, zirconium di(n-butoxide) bisacetylacetonate, tetrakis(acetylacetonate) zirconium, and tetrakis(cyclopentadienyl) zirconium.

An amount of the zirconium-containing compound in the second passivation layer coating liquid is appropriately selected depending on the intended purpose without any limitation.

—Hafnium-Containing Compound—

Examples of the hafnium-containing compound include an inorganic hafnium compound, and an organic hafnium compound.

Examples of the inorganic hafnium compound include hafnium fluoride, hafnium chloride, hafnium bromide, hafnium iodide, hafnium carbonate, and hafnium sulfate.

The organic hafnium compound is appropriately selected depending on the intended purpose without any limitation, provided that it is a compound containing hafnium and an organic group. The hafnium and the organic group are bonded, for example, with an ionic bond, a covalent bond, or a coordinate bond.

The organic group is appropriately selected depending on the intended purpose without any limitation, and examples thereof include an alkyl group that may have a substituent, an alkoxy group that may have a substituent, an acyloxy group that may have a substituent, an acetylacetonate group that may have a substituent, and a cyclopentadienyl group that may have a substituent. Examples of the alkyl group include a C1-C6 alkyl group. Examples of the alkoxy group include a C1-C6 alkoxy group. Examples of the acyloxy group include a C1-C10 acyloxy group.

Examples of the organic hafnium compound include hafnium butoxide, hafnium isopropoxide, hafnium 2-ethylhexanoate, hafnium di(n-butoxide)bisacetylacetonate, tetrakis(acetylacetonate) hafnium, and bis(cyclopentadienyl) dimethyl hafnium.

An amount of the hafnium-containing compound in the second passivation layer coating liquid is appropriately selected depending on the intended purpose without any limitation.

—Solvent—

The solvent is appropriately selected depending on the intended purpose without any limitation, provided that it is a solvent capable of stably dissolving or dispersing the aforementioned various compounds. Examples of the solvent include toluene, xylene, mesitylene, cymene, pentylbenzene, dodecylbenzene, bicyclohexyl, cyclohexylbenzene, decane, undecane, dodecane, tridecane, tetradecane, pentadecane, tetralin, decalin, isopropanol, ethyl benzoate, N,N-dimethylformamide, propylene carbonate, 2-ethyl hexanoate, mineral spirits, dimethylpropylene urea, 4-butyrolactone, 2-methoxy ethanol, and water.

An amount of the solvent in the second passivation layer coating liquid is appropriately selected depending on the intended purpose without any limitation.

A composition ratio of the alkaline earth metal-containing compound and the rare-earth element-containing compound (the alkaline earth metal-containing compound:the rare-earth element-containing compound) in the second passivation layer coating liquid is appropriately selected depending on the intended purpose without any limitation, but the composition ratio thereof is preferably within the following range.

In the second passivation layer coating liquid, the composition ratio of the alkaline earth metal and the rare-earth element (the alkaline earth metal:the rare-earth element) is preferably 10.0 mol % to 67.0 mol %: 33.0 mol % to 90.0 mol %, based on the oxide (BeO, MgO, CaO, SrO, BaO, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$) conversion.

A composition ratio of the alkaline earth metal-containing compound, the rare-earth element-containing compound, and the zirconium-containing compound and/or the hafnium-containing compound (the alkaline earth metal-containing compound:the rare-earth element-containing compound:the zirconium-containing compound and/or the hafnium-containing compound) in the second passivation layer coating liquid is appropriately selected depending on the intended purpose without any limitation, but the composition ratio thereof is preferably within the following range.

In the second passivation layer coating liquid, the composition ratio of the alkaline earth metal, the rare-earth element, and the Zr and/or the Hf (the alkaline earth metal: the rare-earth element:the Zr and/or the Hf) is preferably 5.0 mol % to 22.0 mol %: 33.0 mol % to 90.0 mol %: 5.0 mol % to 45.0 mol %, based on the oxide (BeO, MgO, CaO, SrO, BaO, $Sc_2O_3$, $Y_2O_3$, $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $ZrO_2$, $HfO_2$) conversion.

—Formation Method of First Passivation Layer Using First Passivation Layer Coating Liquid, and Formation Method of Second Passivation Layer Using Second Passivation Layer Coating Liquid—

On example of a formation method of the first passivation layer using the first passivation layer coating liquid, or a formation method of the second passivation layer using the second passivation layer coating liquid is explained. The formation method of the first passivation layer, or the second passivation layer contains a coating step, and a heat treatment step, and may further contain other step according to the necessity.

The coating step is appropriately selected depending on the intended purpose without any limitation, provided that it containing applying the first passivation layer coating liquid or the second passivation layer coating liquid onto a base to be coated. A method of the coating is appropriately selected depending on the intended purpose without any limitation, and examples thereof include: a method containing forming a film through a solution process, followed by patterning through photolithography; and a method containing directly forming a film having a desired shape by printing, such as inkjet printing, nanoimprinting, and gravure printing. Examples of the solution process include dip coating, spin coating, die coating, and nozzle printing.

The heat treatment step is appropriately selected depending on the intended purpose without any limitation, provided that it contains heat treating the first passivation layer coating liquid or second passivation layer coating liquid applied on the base to be coated. Note that, when the heat treatment is performed, the first passivation layer coating liquid or second passivation layer coating liquid applied onto the base to be coated may be dried through air drying. As a result of the heat treatment, the solvent is dried, and a composite metal oxide (the first composite metal oxide or the second composite metal oxide) is generated.

In the heat treatment step, the drying of the solvent (referred to as a "drying treatment" hereinafter), and generation of the first composite metal oxide, or the second composite metal oxide (referred to as a "generation treatment" hereinafter) are preferably performed at different temperature. Specifically, it is preferred that after drying the solvent, the temperature be elevated to generate the first composite metal oxide, or the second composite metal oxide. At the time of generation of the first composite metal oxide, for example, at least one selected from the group consisting of the silicon-containing compound, the alkaline earth metal-containing compound, the aluminum-containing compound, and the boron-containing compound is decomposed. At the time of generation of the second composite metal oxide, for example, at least one selected from the group consisting of the alkaline earth metal-containing compound, the rare-earth element-containing compound, the zirconium-containing compound, and the hafnium-containing compound is decomposed.

The temperature of the drying treatment is appropriately selected depending on the solvent contained therein without any limitation. For example, the temperature thereof is 80° C. to 180° C. As for the drying, it is effective to use a vacuum oven for reducing the temperature. The duration of the drying treatment is appropriately selected depending on the intended purpose without any limitation. For example, the duration thereof is 10 minutes to 1 hour.

The temperature of the generation treatment is appropriately selected depending on the intended purpose without any limitation, but the temperature thereof is preferably 100° C. or higher but lower than 450° C., more preferably 200° C. to 400° C. The duration of the generation treatment is appropriately selected depending on the intended purpose without any limitation. For example, the duration thereof is 1 hour to 5 hours.

Note that, in the heat treatment step, the drying treatment and the generation treatment may be continuously performed, or may be performed dividedly with a plurality of steps.

A method of the heat treatment is appropriately selected depending on the intended purpose without any limitation, and examples thereof include a method containing heating the base to be coated. The atmosphere used for the heat treatment is appropriately selected depending on the intended purpose without any limitation, but it is preferably an oxygen atmosphere. As the heat treatment is carried out in the oxygen atmosphere, decomposition products can be promptly discharged from the system, and generation of the first composite metal oxide, or the second composite metal oxide can be accelerated.

It is effective to apply ultraviolet rays having the wavelength of 400 nm or shorter to the material, which has been subjected to the drying treatment, in the heat treatment in view of acceleration of a reaction of the generation treatment. Chemical bonds of the organic material contained in the material, which has been subjected to the drying treatment, are cut and the organic material can be decomposed by applying ultraviolet rays having the wavelength of 400 nm or shorter. Therefore, the first composite metal oxide or the second composite metal oxide can be effectively formed. The ultraviolet rays having the wavelength of 400 nm or shorter are appropriately selected depending on the intended purpose without any limitation, and examples thereof include ultraviolet rays having the wavelength of 222 nm, which are emitted from an excimer lamp. It is also preferable to apply ozone instead of, or in combination with application of the ultraviolet rays. By applying the ozone to the material, which has been subjected to the drying treatment, generation of an oxide is accelerated.

<Gate Insulating Layer>

The gate insulating layer is appropriately selected depending on the intended purpose without any limitation, provided that it is an insulating layer formed between the base and the passivation layer.

A material of the gate insulating layer is appropriately selected depending on the intended purpose without any limitation, and examples thereof include: a material that has been widely used for manufacturing, such as $SiO_2$, $SiN_x$, and $Al_2O_3$; a high dielectric constant material, such as $La_2O_3$, and $HfO_2$; and an organic material, such as polyimide (PI), and a fluororesin.

—Formation Method of Gate Insulating Layer—

A formation method of the gate insulating layer is appropriately selected depending on the intended purpose without any limitation, and examples thereof include: a vacuum film forming method, such as sputtering, chemical vapor deposition (CVD), and atomic layer deposition (ALD); and a printing method, such as spin coating, die coating, and inkjet printing.

The average film thickness of the gate insulating layer is appropriately selected depending on the intended purpose without any limitation, but the average film thickness thereof is preferably 50 nm to 3 μm, more preferably 100 nm to 1 μm.

<Source Electrode and Drain Electrode>

The source electrode and the drain electrode are appropriately selected depending on the intended purpose without any limitation, provided that they are electrodes for taking electric current out from the field-effect transistor.

The source electrode and the drain electrode are formed to be in contact with the gate insulating layer.

A material of the source electrode, and the drain electrode is appropriately selected depending on the intended purpose without any limitation, and examples thereof include: a metal (e.g., Mo, Al, Au, Ag, and Cu) and an alloy thereof; a transparent electrically conductive oxide, such as indium tin oxide (ITO), and antimony-doped tin oxide (ATO); and an organic electric conductor, such as polyethylene dioxythiophene (PEDOT), and polyaniline (PANI).

—Formation Method of Source Electrode and Drain Electrode—

The formation method of the source electrode and the drain electrode is appropriately selected depending on the intended purpose without any limitation, and examples thereof include: (i) a method containing forming a film through sputtering, or dip coating, followed by patterning the film through photolithography; and (ii) a method containing directly forming a film of a desired shape through a printing process, such as inkjet printing, nanoimprinting, and gravure printing.

The average film thickness of the source electrode and the drain electrode is appropriately selected depending on the intended purpose without any limitation, but the average film thickness thereof is preferably 20 nm to 1 μm, more preferably 50 nm to 300 nm.

<Semiconductor Layer>

The semiconductor layer is formed at least between the source electrode, and the drain electrode.

Here, the "between" means a position at which the semiconductor layer functions the field-effect transistor together with the source electrode and the drain electrode, and the position thereof is appropriately selected depending on the intended purpose without any limitation, it is the aforementioned position.

The semiconductor layer is in contact with the gate insulating layer, the source electrode, and the drain electrode.

A material of the semiconductor layer is appropriately selected depending on the intended purpose without any limitation, and examples thereof include a silicon semiconductor, and an oxide semiconductor.

Examples of the silicon conductor include amorphous silicon, and polycrystalline silicon.

Examples of the oxide semiconductor include InGa—Zn—O, In—Zn—O, and In—Mg—O.

Among them, an oxide semiconductor is preferable.

—Formation Method of Semiconductor Layer—

The formation method of the semiconductor layer is appropriately selected depending on the intended purpose without any limitation. Examples thereof include: a method containing forming a film through a vacuum process, such as sputtering, pulsed laser deposition (PLD), chemical vapor deposition (CVD), and atomic layer deposition (ALD), or a solution process, such as dip coating, spin coating, and die coating, followed by patterning through photolithography; and a method containing directly forming a film of a desired shape through a printing method, such as inkjet printing, nanoimprinting, and gravure printing.

The average film thickness of the semiconductor layer is appropriately selected depending on the intended purpose without any limitation, but the average film thickness thereof is preferably 5 nm to 1 μm, more preferably 10 nm to 0.5 μm.

<Gate Electrode>

The gate electrode is appropriately selected depending on the intended purpose without any limitation, provided that it is an electrode for applying gate voltage to the field-effect transistor.

The gate electrode is in contact with the gate insulating layer, and faces the semiconductor layer with the gate insulating layer being in between.

A material of the gate electrode is appropriately selected depending on the intended purpose without any limitation, and examples thereof include: a metal (e.g., Mo, Al, Au, Ag, and Cu) and an alloy thereof; a transparent electrically conductive oxide, such as indium tin oxide (ITO), and antimony-doped tin oxide (ATO); and an organic electric conductor, such as polyethylene dioxythiophene (PEDOT), and polyaniline (PANI).

—Formation Method of Gate Electrode—

The formation method of the gate electrode is appropriately selected depending on the intended purpose without any limitation, (i) a method containing forming a film through sputtering, or dip coating, followed by patterning the film through photolithography; and (ii) a method containing directly forming a film of a desired shape through a printing process, such as inkjet printing, nanoimprinting, and gravure printing.

The average film thickness of the gate electrode is appropriately selected depending on the intended purpose without any limitation, but the average film thickness thereof is preferably 20 nm to 1 μm, more preferably 50 nm to 300 nm.

A structure of the field-effect transistor is appropriately selected depending on the intended purpose without any limitation, and examples thereof include field-effect transistors of the following structures.

(1) A field-effect transistor containing the base, the gate electrode formed on the base, the gate insulating layer formed on the gate electrode, the source electrode and the drain electrode both formed on the gate insulating layer, the semiconductor layer formed between the source electrode and the drain electrode, the first passivation layer formed on the semiconductor layer, and the second passivation layer formed on the first passivation layer.

(2) A field-effect transistor containing the base, the source electrode and the drain electrode both formed on the base, the semiconductor layer formed between the source electrode and the drain electrode, the gate insulating layer formed on the source electrode, the drain electrode, and the semiconductor layer, the gate electrode formed on the gate insulating layer, the first passivation layer formed on the gate electrode, and the second passivation layer formed on the first passivation layer.

(3) A field-effect transistor containing the base, the gate electrode formed on the base, the gate insulating layer formed on the gate electrode, the source electrode and the drain electrode both formed on the gate insulating layer, the semiconductor layer formed between the source electrode and the drain electrode, the second passivation layer formed on the semiconductor layer, and the first passivation layer formed on the second passivation layer.

(4) A field-effect transistor containing the base, the source electrode and the drain electrode both formed on the base, the semiconductor layer formed between the source electrode and the drain electrode, the gate insulating layer formed on the source electrode, the drain electrode, and the semiconductor layer, the gate electrode formed on the gate insulating layer, the second passivation layer formed on the gate electrode, and the first passivation layer formed on the second passivation layer.

Figure 3A:
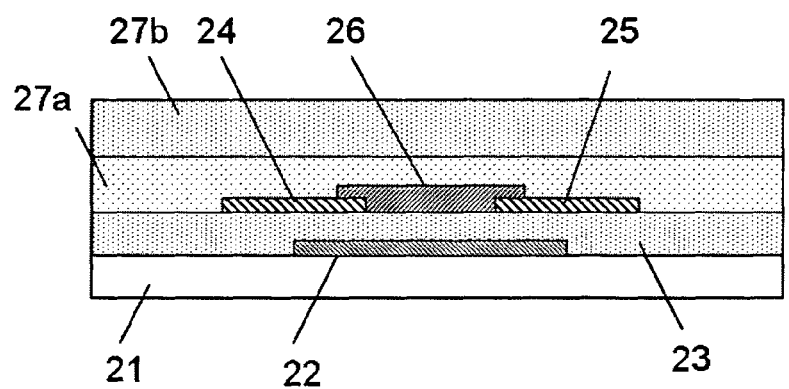
FIG. 3A is a diagram illustrating one example (bottom contact/bottom gate) of the field-effect transistor of the present invention.
Figure 3B:
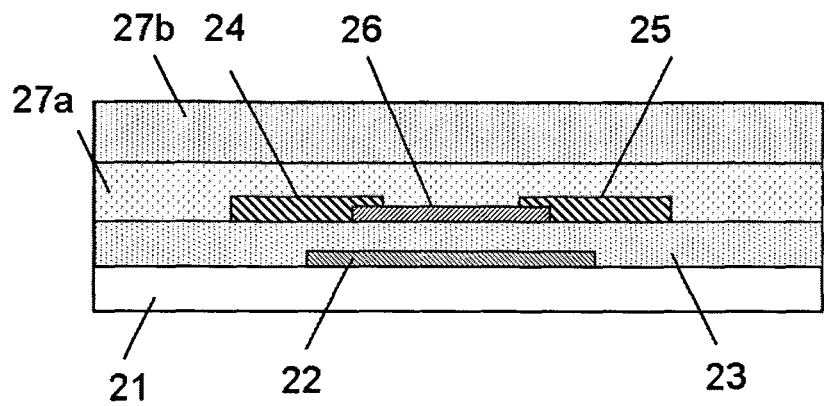
FIG. 3B is a diagram illustrating one example (top contact/bottom gate) of the field-effect transistor of the present invention.

Examples of the field-effect transistor having the structure of (1) include a bottom contact/bottom gate field-effect transistor (FIG. 3A), and a top contact/bottom gate field-effect transistor (FIG. 3B).

Figure 3C:
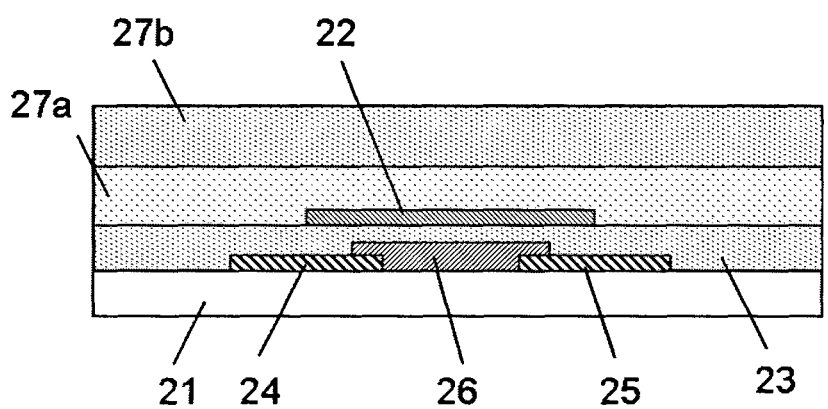
FIG. 3C is a diagram illustrating one example (bottom contact/top gate) of the field-effect transistor of the present invention.
Figure 3D:
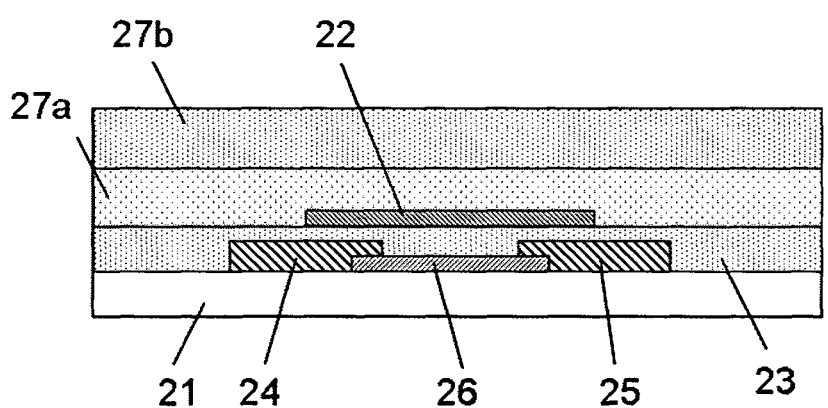
FIG. 3D is a diagram illustrating one example (top contact/top gate) of the field-effect transistor of the present invention.

Examples of the field-effect transistor having the structure of (2) include a bottom contact/top gate field-effect transistor (FIG. 3C), and a top contact/top gate field-effect transistor (FIG. 3D).

In FIGS. 3A to 3D, the reference number 21 denotes the base, 22 denotes the gate electrode, 23 denotes the gate insulating layer, 24 denotes the source electrode, 25 denotes the drain electrode, 26 denotes the oxide semiconductor layer, 27a denotes the first passivation layer, and 27b denotes the second passivation layer.

The field-effect transistor is suitably used in the display element described below, but use thereof is not limited to a display element. For example, the field-effect transistor can be used for an IC card, and an ID tag.

(Display Element)

The display element of the present invention contains at least a light control element, and a driving circuit configured to drive the light control element, and may further contain other members according to the necessity.

<Light Control Element>

The light control element is appropriately selected depending on the intended purpose without any limitation, provided that it is an element configured to control light output according to a driving signal, and examples thereof include an electroluminescent (EL) element, an electrochromic (EC) element, a liquid crystal element, an electrophoretic element, and an electrowetting element.

<Driving Circuit>

The driving circuit is appropriately selected depending on the intended purpose without any limitation, provided that it is a circuit containing the field-effect transistor of the present invention, and configured to drive the light control element.

<Other Members>

The aforementioned other members are appropriately selected depending on the intended purpose without any limitation.

Since the display element contains the field-effect transistor of the present invention, long service life and high-speed operation can be realized.

(Image Display Device)

The image display device of the present invention contains at least a plurality of display elements, a plurality of lines, and a display control device, and may further contain other members according to the necessity.

The image display device is a device configured to display an image corresponding to image data.

<Display Elements>

The display elements are appropriately selected depending on the intended purpose without any limitation, provided that they are display elements of the present invention arranged in a matrix.

<Lines>

The lines are appropriately selected depending on the intended purpose without any limitation, provided that they are lines configured to separately apply gate voltage to field-effect transistors in each of the display elements.

<Display Control Device>

The display control device is appropriately selected depending on the intended purpose without any limitation, provided that it is a device configured to individually control the gate voltage of each of the field-effect transistors through the lines corresponding to the image data.

<Other Members>

The aforementioned other members are appropriately selected depending on the intended purpose without any limitation.

Since the image display device contains the display elements of the present invention, long service life, and high-speed operation can be realized.

The image display device can be used as a display unit in a mobile information device (e.g., a mobile phone, a portable music player, a portable video player, an electronic book, a personal digital assistant (PDA)), or a camera device (e.g., a still camera, a video camera). Moreover, the image display device can be used as a display unit for various types of information in a transport system (e.g., a car, an air craft, a train, and a ship). Furthermore, the image display device can be used as a display unit for various types of information in a measuring device, an analysis device, medical equipment, or advertising media.

(System)

The system of the present invention contains at least the image display device of the present invention, and an image data generating device.

The image data generating device is a device configured to generate an image data based on image information to be displayed, and to output the generated image data to the image display device.

The display element, image display device, and system of the present invention are explained with reference to the drawings hereinafter.

First, a television device is explained as one example of the system of the present invention.

For example, the television device as one example of the system of the present invention can have the structure disclosed in the paragraphs [0038] to [0058] and FIG. 1 in JP-A No. 2010-074148.

Next, the image display device of the present invention is explained.

Figure 2:
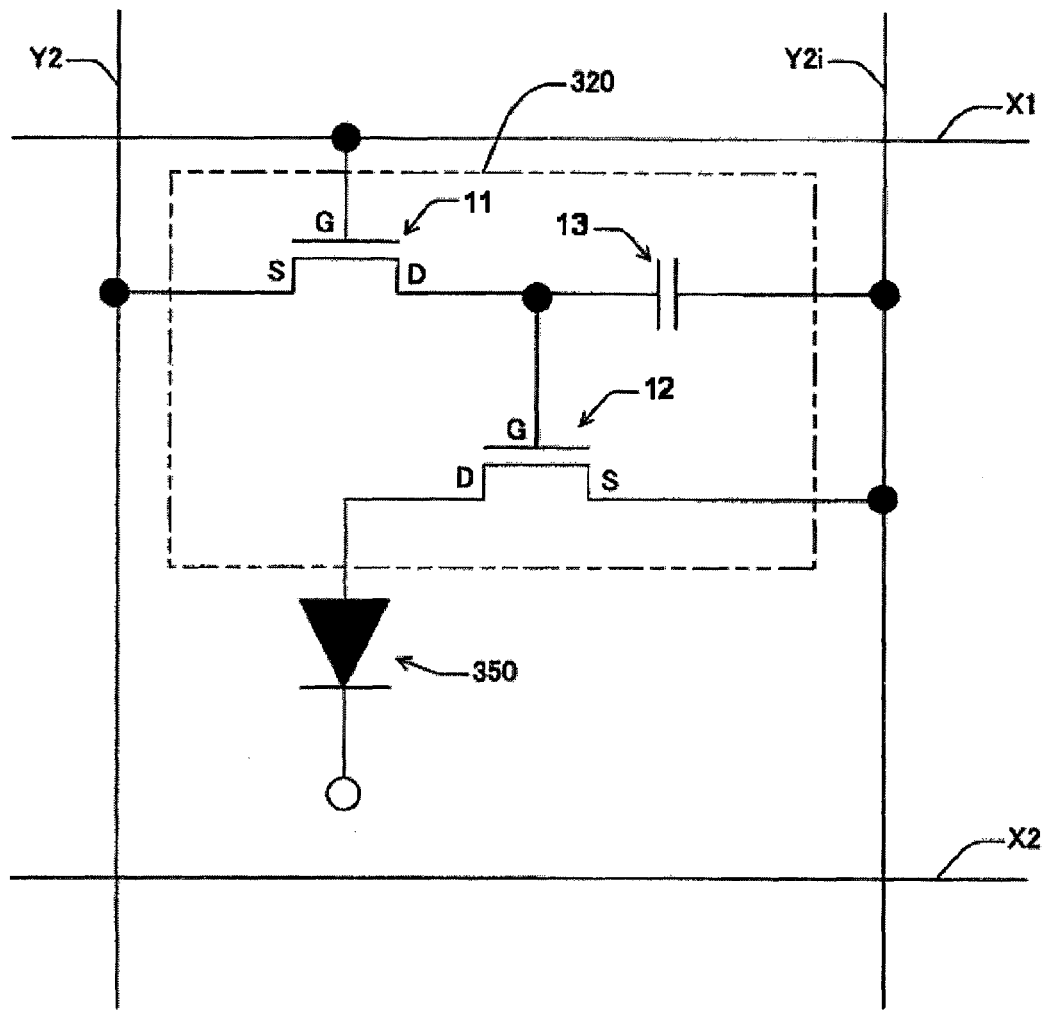
FIG. 2 is a diagram for explaining one example of the display element of the present invention.

For example, the image display device of the present invention can have the structure disclosed in the paragraphs [0059] to [0060], and FIGS. 2 and 3 in JP-A No. 2010-074148.

Next, the display element of the present invention is explained with reference to the drawings.

FIG. 1 is a drawing illustrating a display 310, in which display elements are arranged in a matrix.

As illustrated in FIG. 1, the display 310 contains "n" number of scanning lines (X0, X1, X2, X3, . . . Xn−2, Xn−1) arranged along the X axis direction with a constant interval, "m" number of data lines (Y0, Y1, Y2, Y3, . . . Ym−1) arranged along the Y axis direction with a constant interval, and "m" number of current supply lines (Y0$i$, Y1$i$, Y2$i$, Y3$i$, . . . Ym−1i) arranged along the Y axis direction with a constant interval.

As described above, the display element can be specified with the scanning line and the data line.

FIG. 2 is a schematic diagram illustrating one example of the display element of the present invention.

As illustrated as one example in FIG. 2, the display element contains an organic electroluminescent (EL) element 350, and a driving circuit 320 configured to emit light from the organic EL element 350. Specifically, the display 310 is an organic EL display of a so-called active matrix system. Moreover, the display 310 is a 32-inch color display. Note that, a size of the display is not limited to the aforementioned size.

The driving circuit 320 of FIG. 2 is explained.

The driving circuit 320 contains two field-effect transistors 11, 12, and a capacitor 13.

The field-effect transistor 11 functions as a switching element. The gate electrode G is connected to the predetermined scanning line, and the source electrode S is connected to the predetermined data line. Moreover, the drain electrode D is connected to one terminal of the capacitor 13.

The capacitor 13 is configured to save the state of the field-effect transistor 11, i.e. data. The other terminal of the capacitor 13 is connected to the predetermined current supply line.

The field-effect transistor 12 is configured to supply large electric current to the organic EL element 350. The gate electrode G is connected to the drain electrode D of the field-effect transistor 11. The drain electrode D is connected to the anode of the organic EL element 350, and the source electrode S is connected to the predetermined current supply line.

As the field-effect transistor 11 is turned in the state of "On," the organic EL element 350 is driven by the field-effect transistor 12.

As illustrated as one example in FIG. 3A, the field-effect transistors 11, 12 each contain a base 21, a gate electrode 22, a gate insulating layer 23, a source electrode 24, a drain electrode 25, an oxide semiconductor layer 26, a first passivation layer 27*a*, and a second passivation layer 27*b*.

The field-effect transistors 11, 12 can be formed with the material, by the process mentioned in the descriptions of the field-effect transistor of the present invention.

Figure 4:
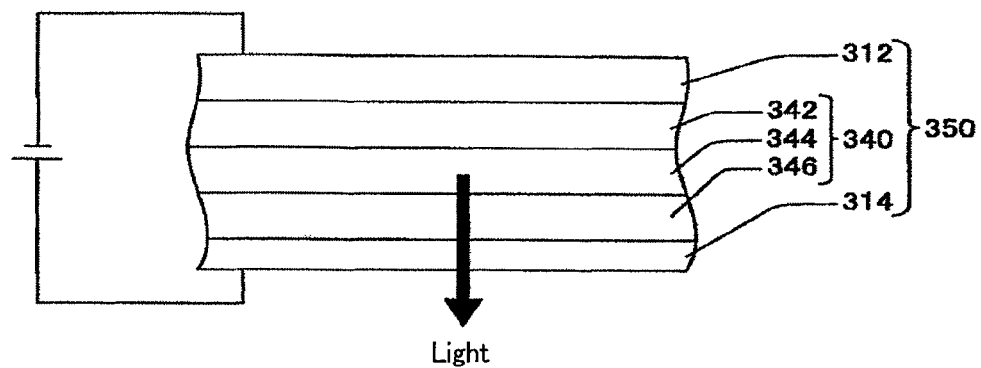
FIG. 4 is a schematic diagram illustrating one example of an organic EL element.

FIG. 4 is a schematic diagram illustrating one example of an organic EL element.

In FIG. 4, the organic EL element 350 contains a cathode 312, an anode 314, and an organic EL thin film layer 340.

A material of the cathode 312 is appropriately selected depending on the intended purpose without any limitation, and examples thereof include aluminum (Al), magnesium (Mg)-silver (Ag) alloy, aluminum (Al)-lithium (Li) alloy, indium tin oxide (ITO). Note that, the magnesium (Mg)-silver (Ag) alloy forms a high reflectance electrode with a sufficient thickness thereof, and an extremely thin film (less than about 20 nm) thereof forms a semi-transparent electrode. In FIG. 4, light is taken out from the side of the anode, but light can be taken out from the side of the cathode, by making the cathode a transparent or semi-transparent electrode.

A material of the anode 314 is appropriately selected depending on the intended purpose without any limitation, and examples thereof include indium tin oxide (ITO), indium zinc oxide (IZO), and silver (Ag)-neodymium (Nd) alloy. Note that, in the case where the silver alloy is used, a resulting electrode becomes a high reflectance electrode, which is suitable for taking light out from the side of the cathode.

The organic EL thin film layer 340 contains an electron transporting layer 342, a light emitting layer 344, and a hole transporting layer 346. The electron transporting layer 342 is connected to the cathode 312, and the hole transporting layer 346 is connected to the anode 314. The light emitting layer 344 emits light, as the predetermined voltage is applied between the anode 314 and the cathode 312.

Here, the electron transporting layer 342 and the light emitting layer 344 may form one layer. Moreover, an electron injecting layer may be provided between the electron transporting layer 342 and the cathode 312. Further, a hole injecting layer may be provided between the hole transporting layer 346 and the anode 314.

In FIG. 4, as for the light control element, the so-called "bottom emission" organic EL element, in which light is taken out from the side of the substrate, is explained above. However, the light control element may be a "top emission" organic EL element, in which light is taken out from the opposite side to the substrate.

Figure 5:
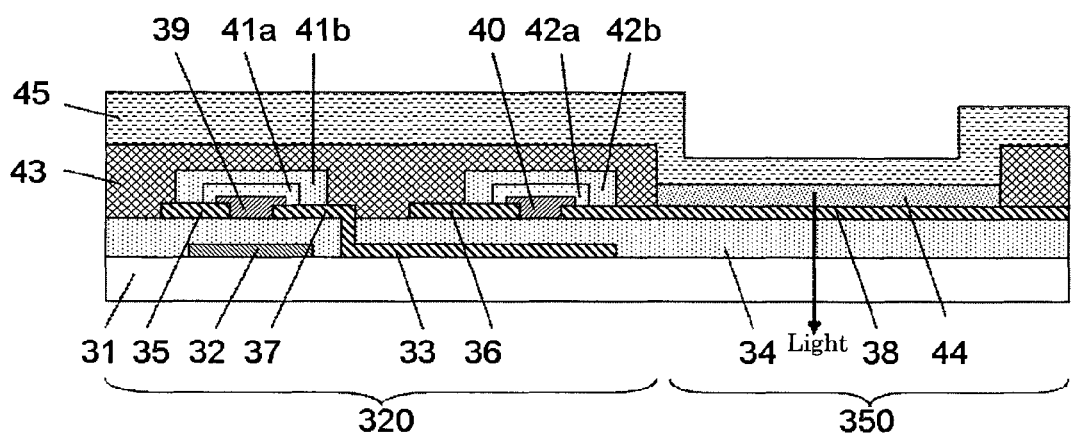
FIG. 5 is a schematic diagram illustrating one example of the display element of the present invention.

FIG. 5 illustrates a display element combining an organic El element 350, and a driving circuit 320.

The display element contains a base 31, gate electrodes (I, II) 32, 33, a gate insulating layer 34, source electrodes (I, II) 35, 36, drain electrodes (I, II) 37, 38, oxide semiconductor layers (I, II) 39, 40, passivation layers (I-1, I-2, II-1, II-2) 41*a*, 41*b*, 42*a*, 42*b*, an interlayer insulating layer 43, an organic EL layer 44, and a cathode 45. The drain electrode (I) 37 and the gate electrode (II) 33 are connected to each other through a through-hole formed in the gate insulating layer 34.

As a matter of practical convenience, the capacitor is appeared to be formed between the gate electrode (II) 33 and the drain electrode (II) 38 in FIG. 5. In fact, the position for forming the capacitor is not limited, and a capacitor of an appropriate capacitor can be designed in an appropriate position.

In the display element of FIG. 5, moreover, the drain electrode (II) 38 functions as an anode of the organic EL element 350.

The base 31, the gate electrodes (I, II) 32, 33, the gate insulating layer 34, the source electrodes (I, II) 35, 36, the drain electrodes (I, II) 37, 38, the oxide semiconductor layers (I, II) 39, 40, and the passivation layers (I-1, I-2, II-1, II-2) 41*a*, 41*b*, 42*a*, 42*b* can be formed with the materials, by the processes mentioned in the descriptions of the field-effect transistor of the present invention.

Note that, the passivation layer (I-1) 41*a* corresponds to the first passivation layer of the field-effect transistor of the present invention. The passivation layer (I-2) 41*b* corresponds to the second passivation layer of the field-effect transistor of the present invention. The passivation layer (II-1) 41*c* corresponds to the first passivation layer of the field-effect transistor of the present invention. The passivation layer (II-2) 41*d* corresponds to the second passivation layer of the field-effect transistor of the present invention.

A material of the interlayer insulating layer 43 (leveling film) is appropriately selected depending on the intended purpose without any limitation, and examples thereof include an organic material, an inorganic material, and an organic-inorganic composite material.

Examples of the organic material include: a resin, such as polyimide, an acrylic resin, a fluororesin, a non-fluororesin, an olefin resin, and a silicone resin; and a photosensitive resin using any of the aforementioned resins.

Examples of the inorganic material include a spin-on-glass (SOG) material, such as AQUAMICA, manufactured by AZ Electronic Materials.

Examples of the organic-inorganic composite material include the organic-inorganic composite compound containing a silane compound, which is disclosed in JP-A No. 2007-158146.

The interlayer insulating layer preferably has barrier properties against moisture, oxygen, and hydrogen contained in the atmosphere.

The formation process of the interlayer insulating layer is appropriately selected depending on the intended purpose without any limitation, and examples thereof include: a method containing directly forming a film of a desired shape through spin coating, inkjet printing, slit coating, nozzle printing, gravure printing, or dip coating; and a method containing patterning a photosensitive material through photolithography.

It is effective to stabilize characteristics of the field-effect transistor constituting the display element by performing a heat treatment as a post treatment, after forming the interlayer insulating layer.

The production methods of the organic EL layer 44 and the cathode 45 are appropriately selected depending on the intended purpose without any limitation, and examples thereof include: a vacuum film forming method (e.g., vacuum deposition, and sputtering); and a solution process (e.g., inkjet printing, and nozzle coating).

As described above, a so-called "bottom emission" organic EL element where emitted light is taken out from the side of the base can be produced as a display element. In this case, the base 31, the gate insulating layer 34, and the second drain electrode (anode) 38 need to be transparent.

In FIG. 5, the structure where the organic EL element 350 is arranged next to the driving circuit 320 is explained.

Figure 6:
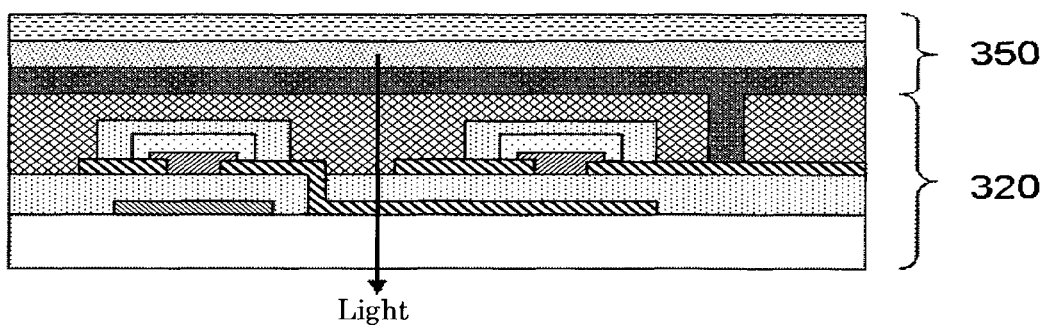
FIG. 6 is a schematic diagram illustrating another example of the display element of the present invention.

However, a structure of the display element may be also a structure where the organic EL element 350 is provided at the upper side of the driving circuit 320 as illustrated in FIG. 6. In this case, the organic EL element is also a so-called "bottom emission" organic EL element where emitted light is taken out from the side of the base, and therefore the driving circuit 320 needs to be transparent. As for the source electrode and drain electrode, or the anode, preferably used is an electric conductive transparent oxide, such as ITO, $In_2O_3$, $SnO_2$, ZnO, Ga-added ZnO, Al-added ZnO, and Sb-added $SnO_2$.

Figure 7:
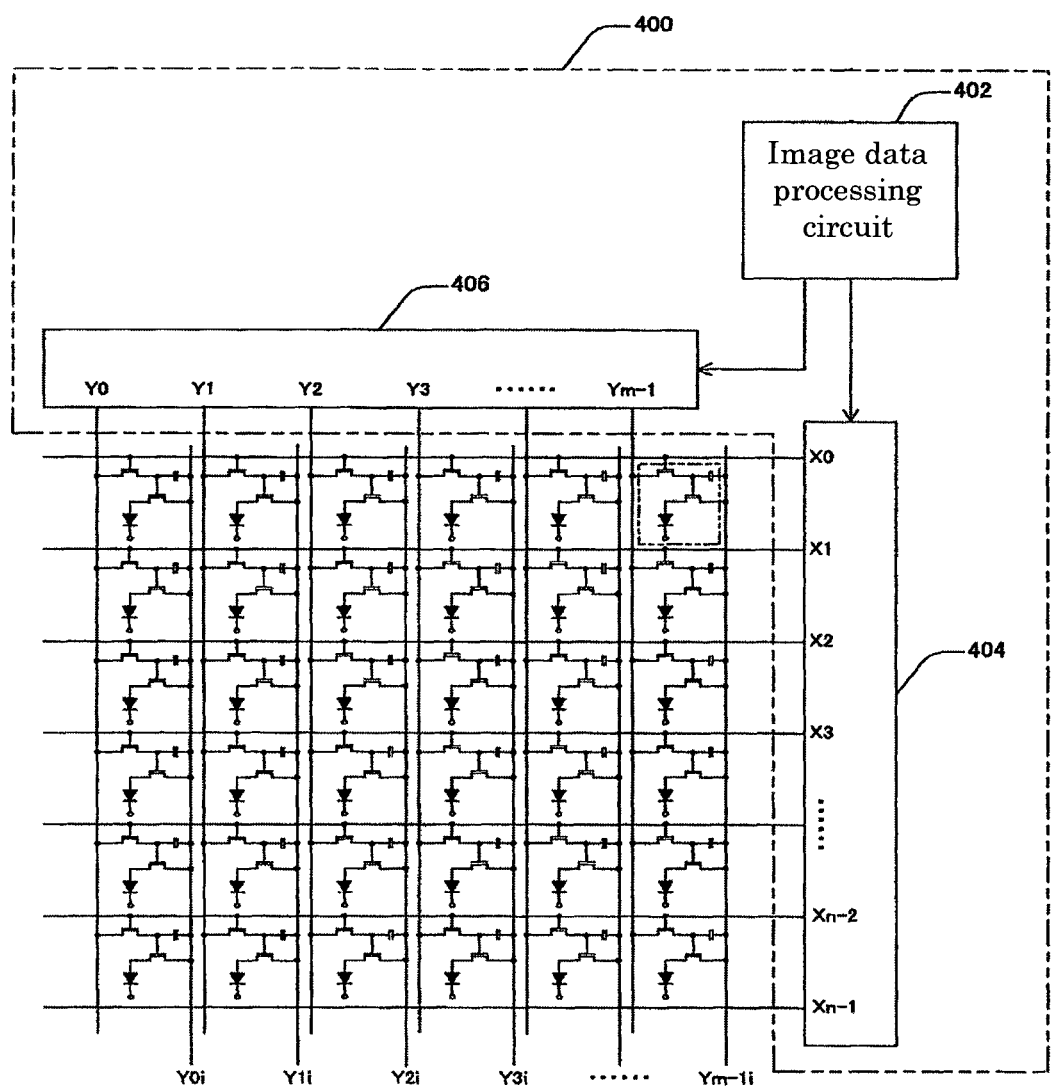
FIG. 7 is a diagram for explaining a display control device.

As illustrated as one example in FIG. 7, the display control device 400 contains an image data processing circuit 402, a scanning line driving circuit 404, and a data line driving circuit 406.

The image data processing circuit 402 judges luminance of a plurality of the display elements 302 in the display 310 based on output signal of the image output circuit.

The scanning line driving circuit 404 individually applies voltage to the number "n" of scanning lines according to the instructions of the image data processing circuit 402.

The data line driving circuit 406 individually applies voltage to the number "m" of data lines according to the instructions of the image data processing circuit 402.

Note that, in the embodiment above, the case where the organic EL thin film layer is composed of an electron transporting layer, a light emitting layer, and a hole transporting layer is explained, but the structure of the organic EL thin film layer is not limited to such the structure. For example, an electron transporting layer and a light emitting layer may be combined as one layer. Moreover, an electron injecting layer may be provided between the electron transporting layer and the cathode. Furthermore, a hole injecting layer may be provided between the hole transporting layer and the anode.

In the embodiment above, moreover, a so-called "bottom emission" organic EL element where emitted light is taken out from the side of the base is explained, but the type thereof is not limited to the bottom emission. For example, light may be taken out from the opposite side of the base by using a high reflective electrode, such as a silver (Ag)-neodymium (Nd) alloy, as the anode 314, and using a semi-transparent electrode, such as a magnesium (Mg)-silver (Ag) alloy, or a transparent electrode, such as ITO, as the cathode 312.

Moreover, the embodiment above explains the case where the light control element is an organic EL element is explained, but the light control element is not limited to the organic EL element. For example, the light control element may be an electrochromic element. In this case, the display 310 is an electrochromic display.

Figure 8:
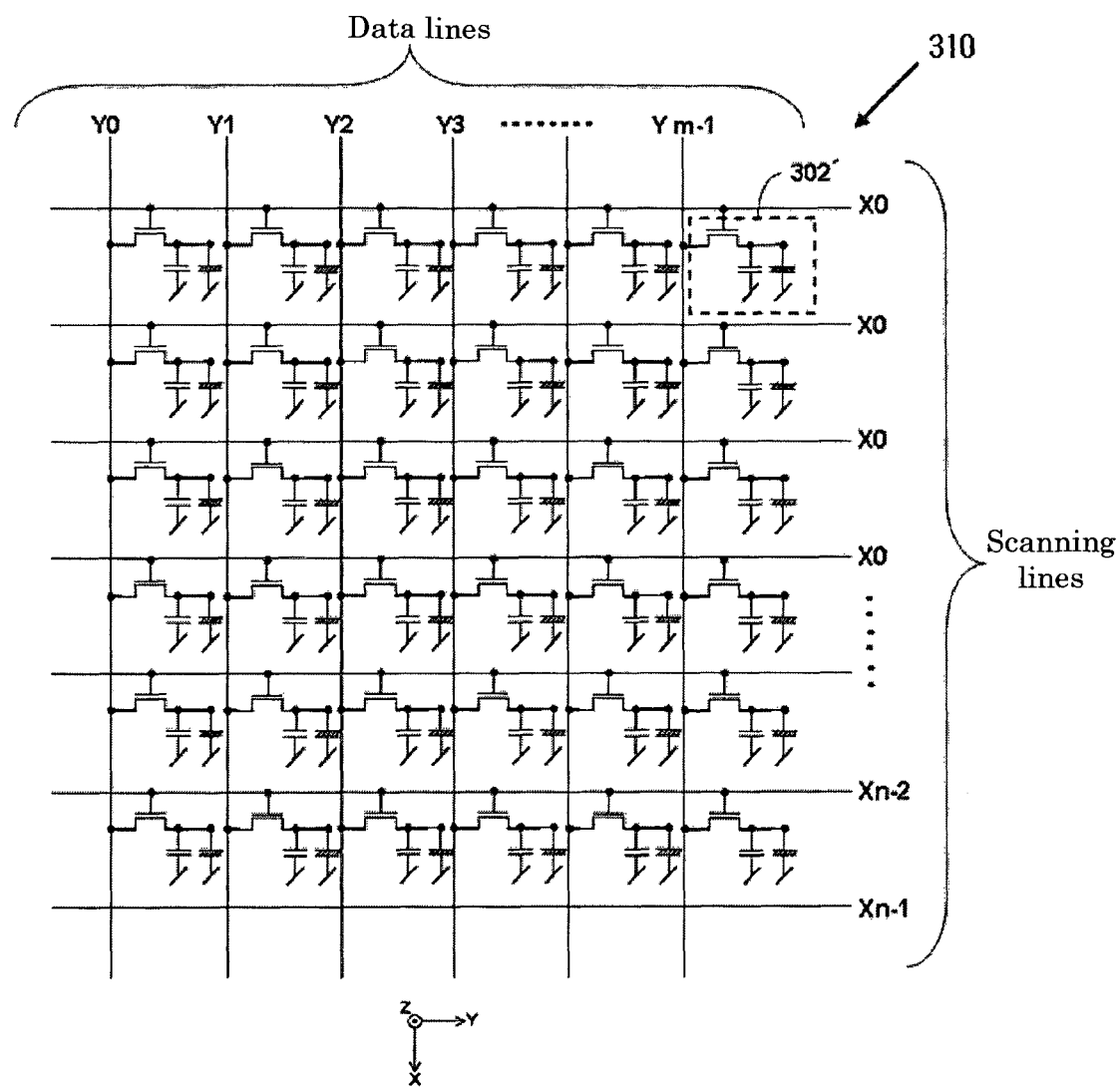
FIG. 8 is a diagram for explaining a liquid crystal display.

Moreover, the light control element may be a liquid crystal element. In this case, the display 310 is a liquid crystal display. As illustrated as one example in FIG. 8, it is not necessary to provide a current supply line to the display element 302'.

Figure 9:
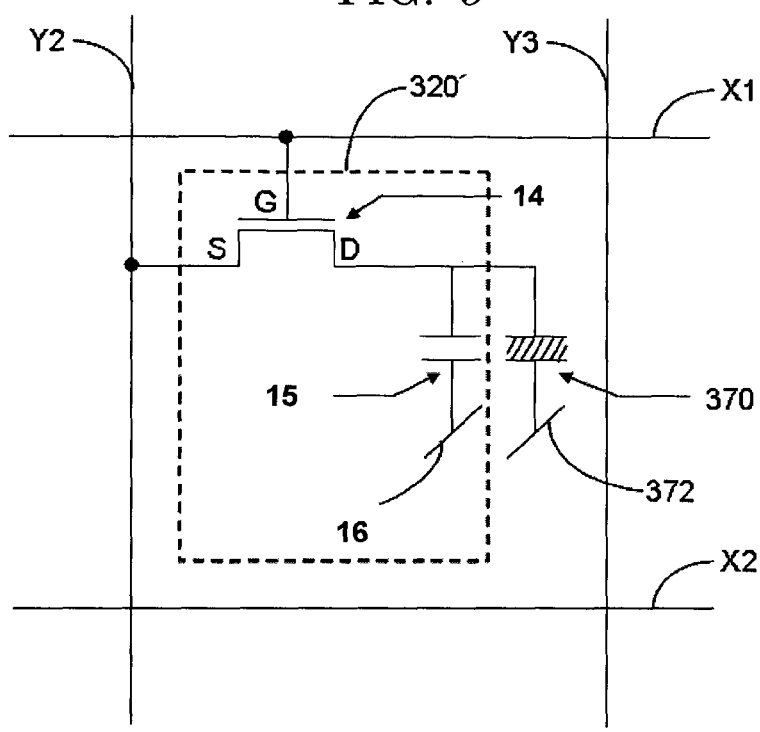
FIG. 9 is a diagram for explaining the display element in FIG. 8.

In this case, moreover, the driving circuit 320' can be composed of one field-effect transistor 14, which is similar to the aforementioned field-effect transistor (11, 12), and a capacitor 15, as illustrated as one example in FIG. 9. In the field-effect transistor 14, the gate electrode G is connected to the predetermined scanning line, and the source electrode S is connected to the predetermined data line. Moreover, the drain electrode D is connected to a pixel electrode of the liquid crystal element 370 and the capacitor 15. Note that, in FIG. 9, the referential numbers 16 and 372 each denote a counter electrode (common electrode) of the liquid crystal element 370.

In the embodiment, the light control element may be an electrophoretic element. Moreover, the light control element may be an electrowetting element.

In the embodiment above, moreover, a case where the display is a color display is explained, but the embodiment thereof is not limited thereto.

Note that, the field-effect transistor according to the present embodiment can be also used for ones (e.g., an IC card, and ID tag) other than the display element.

The display element, image display device, and system using the field-effect transistor of the present invention enable high-speed operation, and achieve long service life.

EXAMPLES

Examples of the present invention are explained hereinafter, but Examples shall not be construed as to limit the scope of the present invention in any way. In Examples below, "%" denotes "% by mass," unless otherwise stated.

Example 1

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.11 mL of a toluene solution of calcium 2-ethylhexanoate (Ca content: 4.9%, Strem 93-2014, manufactured by Strem Chemicals Inc.), and 0.52 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-1.

—Production of Second Passivation Layer Coating Liquid—

In 1 mL of toluene, 0.99 mL of a toluene solution of lanthanum 2-ethylhexanoate (La content: 7%, Wako 122-033371, manufactured by Wako Chemical, Ltd.), and 0.27 mL of a toluene solution of strontium 2-ethylhexanoate (Sr content: 2%, Wako 195-09561, manufactured by Wako Chemical, Ltd.) were blended to thereby obtain a second passivation layer coating liquid. A second composite metal oxide formed with the second passivation layer coating liquid had the composition as depicted in Table 1-1.

Figure 15:
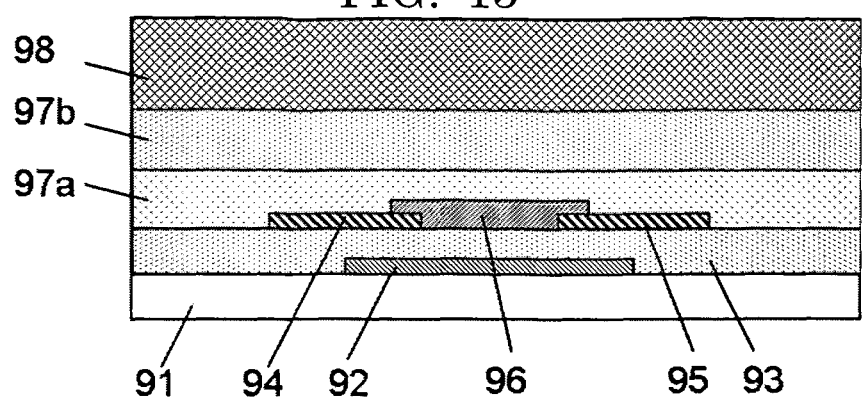
FIG. 15 is a schematic diagram illustrating the field-effect transistor produced in each of Examples 1 to 16, and Comparative Examples 4 and 7.

Next, a bottom contact/bottom gate field-effect transistor as illustrated in FIG. 15 was produced.

—Formation of Gate Electrode—

First, a gate electrode 92 was formed on a glass substrate (base 91). Specifically, a molybdenum (Mo) film was formed on the glass substrate (base 91) by DC sputtering to give the average film thickness of about 100 nm. Thereafter, a photoresist was applied thereto, and the resultant was subjected to prebaking, exposure by an exposure device, and developing, to thereby form a resist pattern having the same pattern as that of a gate electrode 92 to be formed. Moreover, the region of the Mo film, on which the resist pattern had not been formed, was removed by reactive ion etching (RIE). Thereafter, the resist pattern was also removed, to thereby form a gate electrode 92 composed of the Mo film.

—Formation of Gate Insulating Layer—

Next, a gate insulating layer 93 was formed on the gate electrode 92. Specifically, an $Al_2O_3$ film was formed on the gate electrode 92 and the glass substrate (base 91) by RF sputtering to give the average film thickness of about 300 nm, to thereby form a gate insulating layer 93.

—Formation of Source Electrode and Drain Electrode—

Next, a source electrode 94 and a drain electrode 95 were formed on the gate insulating layer 93. Specifically, a molybdenum (Mo) film was formed on the gate insulating layer 93 by DC sputtering to give the average film thickness of about 100 nm. Thereafter, a photoresist was applied onto the Mo film, and the resultant was subjected to prebaking, exposure by an exposure device, and developing, to thereby form a resist pattern having the same pattern as that of a source electrode 94 and drain electrode 95 to be formed. Moreover, the region of the Mo film, on which the resist pattern had not been formed, was removed by RIE. Thereafter, the resist pattern was also removed, to thereby form a source electrode 94 and a drain electrode 95, each of which was composed of the Mo film.

—Formation of Oxide Semiconductor Layer—

Next, an oxide semiconductor layer 96 was formed. Specifically, a Mg—In based oxide ($In_2MgO_4$) film was formed to give the average film thickness of about 100 nm. Thereafter, a photoresist was applied onto the Mg—In based oxide film, and the resultant was subjected to prebaking, exposure by an exposure device, and developing, to thereby form a resist pattern having the same pattern as that of an oxide semiconductor layer 96 to be formed. Moreover, the region of the Mg—In based oxide film, on which the resist pattern had not been formed, was removed by wet etching. Thereafter, the resist pattern was also removed, to thereby form an oxide semiconductor layer 96. As a result, the oxide semiconductor layer 96 was formed in a manner that a channel was formed between the source electrode 94 and the drain electrode 95.

—Formation of Passivation Layer—

Next, 0.4 mL of the first passivation layer coating liquid was dropped on the substrate, and applied thereon by spin coating under the predetermined conditions (3,000 rpm for 20 seconds, followed by stopping the rotations to 0 rpm within 5 seconds). Subsequently, a drying treatment was performed in the atmospheric air at 120° C. for 1 hour, and then baking was performed in the $O_2$ atmosphere at 400° C. for 3 hours, to thereby form a first composite metal film (first passivation layer) as a first passivation layer 97a.

Subsequently, 0.4 mL of the second passivation layer coating liquid was dropped on the first passivation layer 97a, and applied thereon by spin coating under the predetermined conditions (500 rpm for 5 seconds, then 3,000 rpm for 20 seconds, followed by stopping the rotations to 0 rpm within 5 seconds). Subsequently, a drying treatment was performed in the atmospheric air at 120° C. for 1 hour, and then baking was performed in the $O_2$ atmosphere at 400° C. for 3 hours, to thereby form a second composite metal oxide film (second passivation layer) as a second passivation layer 97b on the first passivation layer 97a. Note that, the average film thickness of the first passivation layer 97a and the average film thickness of the second passivation layer 97b were about 25 nm, and about 150 nm, respectively.

—Formation of Interlayer Insulating Layer—

Next, an interlayer insulating layer 98 was formed. Specifically, a positive photosensitive organic-inorganic composite material (ADEKA Nonahybrid Silicone FX series, manufactured by ADEKA CORPORATION) was applied onto the second passivation layer 97b by spin coating, and the resultant was subjected to prebaking, exposure by an exposure device, and developing, to thereby obtain a desired pattern. Thereafter, the obtained pattern was post-baked at 150° C. for 1 hour, followed by at 200° C. for 1 hour.

Finally, a heat treatment was performed at 230° C. for 1 hour as a heating treatment of the post-process, to thereby complete a field-effect transistor. The average film thickness of the interlayer insulating layer was about 1,500 nm.

Example 2

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), and 0.36 mL of a toluene solution of magnesium 2-ethylhexanoate (Mg content: 3%, Strem 12-1260, manufactured by Strem Chemicals Inc.) were blended, to thereby obtain a first passivation layer coating liquid. A first composite metal oxide formed with the first passivation layer coating liquid had the composition as depicted in Table 1-1.

—Production of Second Passivation Layer Coating Liquid—

In 1 mL of toluene, 0.26 g of yttrium 2-ethylhexanoate (Strem 39-2400, manufactured by Strem Chemicals Inc.), 0.05 mL of a toluene solution of calcium 2-ethylhexanoate (Ca content: 4.9%, Strem 93-2014, manufactured by Strem Chemicals Inc.), 0.22 mL of a toluene solution of strontium 2-ethylhexanoate (Sr content: 2%, Wako 195-09561, manufactured by Wako Chemical, Ltd.), and 0.09 mL of a toluene solution of barium 2-ethylhexanoate (Ba content: 8%, Wako 021-09471, manufactured by Wako Chemical, Ltd.) were blended, to thereby obtain a second passivation layer coating liquid. A second composite metal oxide formed with the second passivation layer coating liquid had the composition as depicted in Table 1-1.

A field-effect transistor was produced in the same manner as in Example 1, provided that the first passivation layer coating liquid, and second passivation layer coating liquid produced above were used.

Example 3

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.13 mL of a toluene solution of calcium 2-ethylhexanoate (Ca content: 4.9%, Strem 93-2014, manufactured by Strem Chemicals Inc.), 0.44 mL of a toluene solution of strontium 2-ethylhexanoate (Sr content: 2%, Wako 195-09561, manufactured by Wako Chemical, Ltd.), and 0.11 mL of a toluene solution of barium 2-ethylhexanoate (Ba content: 8%, Wako 021-09471, manufactured by Wako Chemical, Ltd.) were blended, to thereby obtain a first passivation layer coating liquid. A first composite metal oxide formed with the first passivation layer coating liquid had the composition as depicted in Table 1-1.
—Production of Second Passivation Layer Coating Liquid—

In 1 mL of toluene, 0.29 g of europium 2-ethylhexanoate (Strem 93-6311, manufactured by Strem Chemicals Inc.), and 0.23 mL of a toluene solution of magnesium 2-ethylhexanoate (Mg content: 3%, Strem 12-1260, manufactured by Strem Chemicals Inc.) were blended, to thereby obtain a second passivation layer coating liquid. A second composite metal oxide formed with the second passivation layer coating liquid had the composition as depicted in Table 1-1.

A field-effect transistor was produced in the same manner as in Example 1, provided that the first passivation layer coating liquid, and second passivation layer coating liquid produced above were used.

Example 4

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), and 0.15 mL of a toluene solution of calcium 2-ethylhexanoate (Ca content: 4.9%, Strem 93-2014, manufactured by Strem Chemicals Inc.) were blended, to thereby obtain a first passivation layer coating liquid. A first composite metal oxide formed with the first passivation layer coating liquid had the composition as depicted in Table 1-1.
—Production of Second Passivation Layer Coating Liquid—

In 1 mL of toluene, 0.22 g of samarium acetylacetonate trihydrate (Strem 93-6226, manufactured by Strem Chemicals Inc.), 0.05 mL of a toluene solution of gadolinium 2-ethylhexanoate (Gd content: 25%, Strem 64-3500, manufactured by Strem Chemicals Inc.), 0.06 mL of a toluene solution of calcium 2-ethylhexanoate (Ca content: 4.9%, Strem 93-2014, manufactured by Strem Chemicals Inc.), and 0.09 mL of a toluene solution of barium 2-ethylhexanoate (Ba content: 8%, Wako 021-09471, manufactured by Wako Chemical, Ltd.) were blended, to thereby obtain a second passivation layer coating liquid. A second composite metal oxide formed with the second passivation layer coating liquid had the composition as depicted in Table 1-1.

A field-effect transistor was produced in the same manner as in Example 1, provided that the first passivation layer coating liquid, and second passivation layer coating liquid produced above were used.

Example 5

Production of Field-Effect Transistor

—Production of First Passivation layer Coating Liquid—

In 1 mL of toluene, 0.10 mL of HMDS (1,1,1,3,3,3-hexamethyldisilazane, manufactured by TOKYO OHKA KOGYO CO., LTD.), 0.10 mL of a toluene solution of magnesium 2-ethylhexanoate (Mg content: 3%, Strem 12-1260, manufactured by Strem Chemicals Inc.), and 0.38 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-1.
—Production of Second Passivation Layer Coating Liquid—In 1 mL of toluene, 0.18 g of scandium(III) tris(2,2,6,6-tetramethyl-3,5-heptanedionate)hydrate (Sigma-Aldrich Co., LLC. 517607, manufactured by Sigma-Aldrich Co., LLC.), 0.26 g of yttrium 2-ethylhexanoate (Strem 39-2400, manufactured by Strem Chemicals Inc.), 0.07 g of europium 2-ethylhexanoate (Strem 93-6311, manufactured by Strem Chemicals Inc.), 0.06 mL of a toluene solution of calcium 2-ethylhexanoate (Ca content: 4.9%, Strem 93-2014, manufactured by Strem Chemicals Inc.), and 0.13 mL of a toluene solution of barium 2-ethylhexanoate (Ba content: 8%, Wako 021-09471, manufactured by Wako Chemical, Ltd.) were blended, to thereby obtain a second passivation layer coating liquid. A second composite metal oxide formed with the second passivation layer coating liquid had the composition as depicted in Table 1-1.

A field-effect transistor was produced in the same manner as in Example 1, provided that the first passivation layer coating liquid, and second passivation layer coating liquid produced above were used.

Example 6

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.16 mL of aluminum di(s-butoxide) acetoacetate chelate (Al content: 8.4%, Alfa89349, manufactured by Alfa Aesar), 0.05 mL of a toluene solution of magnesium 2-ethylhexanoate (Mg content: 3%, Strem 12-1260, manufactured by Strem Chemicals Inc.), and 0.12 mL of a toluene solution of barium 2-ethylhexanoate (Ba content: 8%, Wako 021-09471, manufactured by Wako Chemical, Ltd.) were blended, to thereby obtain a first passivation layer coating liquid. A first composite metal oxide formed with the first passivation layer coating liquid had the composition as depicted in Table 1-2.
—Production of Second Passivation Layer Coating Liquid—

In 1 mL of toluene, 0.60 mL of a 2-ethylhexanoic acid solution of neodymium 2-ethylhexanoate (Nd content: 12%, Strem 60-2400, manufactured by Strem Chemicals Inc.), and 0.31 mL of a toluene solution of calcium 2-ethylhexanoate (Ca content: 4.9%, Strem 93-2014, manufactured by Strem Chemicals Inc.) were blended, to thereby obtain a second passivation layer coating liquid. A second composite metal oxide formed with the second passivation layer coating liquid had the composition as depicted in Table 1-2.

A field-effect transistor was produced in the same manner as in Example 1, provided that the first passivation layer coating liquid, and second passivation layer coating liquid produced above were used.

Example 7

Production of Field-Effect Transistor

—Production of First Passivation Layer Coating Liquid—
In 1 mL of toluene, 0.10 mL of HMDS (1,1,1,3,3,3-hexamethyldisilazane, manufactured by TOKYO OHKA KOGYO CO., LTD.), 0.11 g of 2-isopropoxy-4,4,5,5-tetramethyl-1,3,2-dioxaborolane (Wako 325-41462, manufactured by Wako Chemical, Ltd.), 0.09 mL of a toluene solution of magnesium 2-ethylhexanoate (Mg content: 3%, Strem 12-1260, manufactured by Strem Chemicals Inc.), and 0.25 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-2.

—Production of Second Passivation Layer Coating Liquid—
In 1 mL of toluene, 0.29 g of europium 2-ethylhexanoate (Strem 93-6311, manufactured by Strem Chemicals Inc.), 0.13 mL of a toluene solution of strontium 2-ethylhexanoate (Sr content: 2%, Wako 195-09561, manufactured by Wako Chemical, Ltd.), and 0.08 mL of a toluene solution of barium 2-ethylhexanoate (Ba content: 8%, Wako 021-09471, manufactured by Wako Chemical, Ltd.) were blended, to thereby obtain a second passivation layer coating liquid. A second composite metal oxide formed with the second passivation layer coating liquid had the composition as depicted in Table 1-2.

A field-effect transistor was produced in the same manner as in Example 1, provided that the first passivation layer coating liquid, and second passivation layer coating liquid produced above were used.

Example 8

Production of Field-Effect Transistor

—Production of First Passivation Layer Coating Liquid—
In 1 mL of toluene, 0.10 mL of HMDS (1,1,1,3,3,3-hexamethyldisilazane, manufactured by TOKYO OHKA KOGYO CO., LTD.), 0.11 mL of aluminum di(s-butoxide) acetoacetate chelate (Al content: 8.4%, Alfa89349, manufactured by Alfa Aesar), 0.07 g of 2-isopropoxy-4,4,5,5-tetramethyl-1,3,2-dioxaborolane (Wako 325-41462, manufactured by Wako Chemical, Ltd.), and 0.27 mL of a toluene solution of calcium 2-ethylhexanoate (Ca content: 4.9%, Strem 93-2014, manufactured by Strem Chemicals Inc.) were blended, to thereby obtain a first passivation layer coating liquid. A first composite metal oxide formed with the first passivation layer coating liquid had the composition as depicted in Table 1-2.

—Production of Second Passivation Layer Coating Liquid—
In 1 mL of toluene, 0.99 mL of a toluene solution of lanthanum 2-ethylhexanoate (La content: 7%, Wako 122-033371, manufactured by Wako Chemical, Ltd.), 0.03 mL of a toluene solution of magnesium 2-ethylhexanoate (Mg content: 3%, Strem 12-1260, manufactured by Strem Chemicals Inc.), 0.14 mL of a toluene solution of strontium 2-ethylhexanoate (Sr content: 2%, Wako 195-09561, manufactured by Wako Chemical, Ltd.), and 0.11 mL of a toluene solution of barium 2-ethylhexanoate (Ba content: 8%, Wako 021-09471, manufactured by Wako Chemical, Ltd.) were blended, to thereby obtain a second passivation layer coating liquid. A second composite metal oxide formed with the second passivation layer coating liquid had the composition as depicted in Table 1-2.

A field-effect transistor was produced in the same manner as in Example 1, provided that the first passivation layer coating liquid, and second passivation layer coating liquid produced above were used.

Example 9

Production of Field-Effect Transistor

—Production of First Passivation Layer Coating Liquid—
In 1 mL of toluene, 0.10 mL of HMDS (1,1,1,3,3,3-hexamethyldisilazane, manufactured by TOKYO OHKA KOGYO CO., LTD.), and 1.42 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-2.

—Production of Second Passivation Layer Coating Liquid—
In 1 mL of toluene, 0.22 g of samarium acetylacetonate trihydrate (Strem 93-6226, manufactured by Strem Chemicals Inc.), 0.01 mL of a toluene solution of calcium 2-ethylhexanoate (Ca content: 4.9%, Strem 93-2014, manufactured by Strem Chemicals Inc.), 0.18 mL of a toluene solution of strontium 2-ethylhexanoate (Sr content: 2%, Wako 195-09561, manufactured by Wako Chemical, Ltd.), and 0.03 mL of a mineral sprits solution of zirconium oxide 2-ethylhexanoate (Zr content: 12%, Wako 269-01116, manufactured by Wako Chemical, Ltd.) were blended, to thereby obtain a second passivation layer coating liquid. A second composite metal oxide formed with the second passivation layer coating liquid had the composition as depicted in Table 1-2.

A field-effect transistor was produced in the same manner as in Example 1, provided that the first passivation layer coating liquid, and second passivation layer coating liquid produced above were used.

Example 10

Production of Field-Effect Transistor

—Production of First Passivation Layer Coating Liquid—
In 1 mL of toluene, 0.10 mL of HMDS (1,1,1,3,3,3-hexamethyldisilazane, manufactured by TOKYO OHKA KOGYO CO., LTD.), 0.06 mL of a toluene solution of magnesium 2-ethylhexanoate (Mg content: 3%, Strem 12-1260, manufactured by Strem Chemicals Inc.), 0.10 mL of a toluene solution of calcium 2-ethylhexanoate (Ca content: 4.9%, Strem 93-2014, manufactured by Strem Chemicals Inc.), and 0.11 mL of a toluene solution of barium 2-ethylhexanoate (Ba content: 8%, Wako 021-09471, manufactured by Wako Chemical, Ltd.) were blended, to thereby obtain a first passivation layer coating liquid. A first composite metal oxide formed with the first passivation layer coating liquid had the composition as depicted in Table 1-2.

—Production of Second Passivation Layer Coating Liquid—
In 1 mL of toluene, 0.31 mL of a toluene solution of gadolinium 2-ethylhexanoate (Gd content: 25%, Strem 64-3500, manufactured by Strem Chemicals Inc.), 0.06 mL of a toluene solution of calcium 2-ethylhexanoate (Ca content: 4.9%, Strem 93-2014, manufactured by Strem Chemicals Inc.), and 0.10 mL of a 2-ethylhexanoic acid solution of hafnium 2-ethylhexanoate (Gelest AKH332, manufactured by Gelest, Inc.) were blended, to thereby obtain a second passivation layer coating liquid. A second composite metal oxide formed with the second passivation layer coating liquid had the composition as depicted in Table 1-2.

A field-effect transistor was produced in the same manner as in Example 1, provided that the first passivation layer coating liquid, and second passivation layer coating liquid produced above were used.

Example 11

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.04 mL of a toluene solution of calcium 2-ethylhexanoate (Ca content: 4.9%, Strem 93-2014, manufactured by Strem Chemicals Inc.), and 0.16 mL of a toluene solution of barium 2-ethylhexanoate (Ba content: 8%, Wako 021-09471, manufactured by Wako Chemical, Ltd.) were blended, to thereby obtain a first passivation layer coating liquid. A first composite metal oxide formed with the first passivation layer coating liquid had the composition as depicted in Table 1-3.

—Production of Second Passivation Layer Coating Liquid—

In 1 mL of toluene, 0.26 g of yttrium 2-ethylhexanoate (Strem 39-2400, manufactured by Strem Chemicals Inc.), 0.04 g of dysprosium acetylacetonate trihydrate (Strem 66-2002, manufactured by Strem Chemicals Inc.), 0.01 mL of a toluene solution of magnesium 2-ethylhexanoate (Mg content: 3%, Strem 12-1260, manufactured by Strem Chemicals Inc.), 0.01 mL of a toluene solution of calcium 2-ethylhexanoate (Ca content: 4.9%, Strem 93-2014, manufactured by Strem Chemicals Inc.), 0.08 mL of a mineral sprits solution of zirconium oxide 2-ethylhexanoate (Zr content: 12%, Wako 269-01116, manufactured by Wako Chemical, Ltd.), and 0.05 mL of a 2-ethylhexanoic acid solution of hafnium 2-ethylhexanoate (Gelest AKH332, manufactured by Gelest, Inc.) were blended, to thereby obtain a second passivation layer coating liquid. A second composite metal oxide formed with the second passivation layer coating liquid had the composition as depicted in Table 1-3.

A field-effect transistor was produced in the same manner as in Example 1, provided that the first passivation layer coating liquid, and second passivation layer coating liquid produced above were used.

Example 12

Production of Field-Effect Transistor

—Production of First Passivation Layer Coating Liquid—

In 1 mL of toluene, 0.11 mL of HMDS (1,1,1,3,3,3-hexamethyldisilazane, manufactured by TOKYO OHKA KOGYO CO., LTD.), 0.10 mL of aluminum di(s-butoxide) acetoacetate chelate (Al content: 8.4%, Alfa89349, manufactured by Alfa Aesar), 0.08 g of 2-isopropoxy-4,4,5,5-tetramethyl-1,3,2-dioxaborolane (Wako 325-41462, manufactured by Wako Chemical, Ltd.), 0.09 mL of a toluene solution of calcium 2-ethylhexanoate (Ca content: 4.9%, Strem 93-2014, manufactured by Strem Chemicals Inc.), and 0.17 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-3.

—Production of Second Passivation Layer Coating Liquid—

In 1 mL of toluene, 0.99 mL of a toluene solution of lanthanum 2-ethylhexanoate (La content: 7%, Wako 122-033371, manufactured by Wako Chemical, Ltd.), 0.27 mL of a toluene solution of strontium 2-ethylhexanoate (Sr content: 2%, Wako 195-09561, manufactured by Wako Chemical, Ltd.), and 0.05 mL of a mineral sprits solution of zirconium oxide 2-ethylhexanoate (Zr content: 12%, Wako 269-01116, manufactured by Wako Chemical, Ltd.) were blended, to thereby obtain a second passivation layer coating liquid. A second composite metal oxide formed with the second passivation layer coating liquid had the composition as depicted in Table 1-3.

A field-effect transistor was produced in the same manner as in Example 1, provided that the first passivation layer coating liquid, and second passivation layer coating liquid produced above were used.

Example 13

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.08 mL of aluminum di(s-butoxide) acetoacetate chelate (Al content: 8.4%, Alfa89349, manufactured by Alfa Aesar), and 0.35 mL of a toluene solution of barium 2-ethylhexanoate (Ba content: 8%, Wako 021-09471, manufactured by Wako Chemical, Ltd.) were blended, to thereby obtain a first passivation layer coating liquid. A first composite metal oxide formed with the first passivation layer coating liquid had the composition as depicted in Table 1-3.

—Production of Second Passivation Layer Coating Liquid—

In 1 mL of toluene, 0.22 g of samarium acetylacetonate trihydrate (Strem 93-6226, manufactured by Strem Chemicals Inc.), 0.02 mL of a toluene solution of magnesium 2-ethylhexanoate (Mg content: 3%, Strem 12-1260, manufactured by Strem Chemicals Inc.), and 0.01 mL of a 2-ethylhexanoic acid solution of hafnium 2-ethylhexanoate (Gelest AKH332, manufactured by Gelest, Inc.) were blended, to thereby obtain a second passivation layer coating liquid. A second composite metal oxide formed with the second passivation layer coating liquid had the composition as depicted in Table 1-3.

A field-effect transistor was produced in the same manner as in Example 1, provided that the first passivation layer coating liquid, and second passivation layer coating liquid produced above were used.

Example 14

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.05 g of 2-isopropoxy-4,4,5,5-tetramethyl-1,3,2-dioxaborolane (Wako 325-41462, manufactured by Wako Chemical, Ltd.), 0.05 mL of a toluene solution of magnesium 2-ethylhexanoate (Mg content: 3%, Strem 12-1260, manufactured by Strem Chemicals Inc.), and 0.23 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-3.

—Production of Second Passivation Layer Coating Liquid—

In 1 mL of toluene, 0.30 g of scandium(III) tris(2,2,6,6-tetramethyl-3,5-heptanedionate)hydrate (Sigma-Aldrich 517607, manufactured by Sigma-Aldrich Co., LLC.), 0.05 g of ytterbium acetylacetonate trihydrate (Strem 70-2202, manufactured by Strem Chemicals Inc.), 0.04 mL of a toluene solution of calcium 2-ethylhexanoate (Ca content: 4.9%, Strem 93-2014, manufactured by Strem Chemicals Inc.), 0.03 mL of a mineral sprits solution of zirconium oxide 2-ethylhexanoate (Zr content: 12%, Wako 269-01116, manufactured by Wako Chemical, Ltd.), and 0.07 mL of a 2-ethylhexanoic acid solution of hafnium 2-ethylhexanoate (Gelest AKH332, manufactured by Gelest, Inc.) were blended, to thereby obtain a second passivation layer coating liquid. A second composite metal oxide formed with the second passivation layer coating liquid had the composition as depicted in Table 1-3.

A field-effect transistor was produced in the same manner as in Example 1, provided that the first passivation layer coating liquid, and second passivation layer coating liquid produced above were used.

Example 15

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.), 0.11 mL of aluminum di(s-butoxide) acetoacetate chelate (Al content: 8.4%, Alfa89349, manufactured by Alfa Aesar), 0.08 g of 2-isopropoxy-4,4,5,5-tetramethyl-1,3,2-dioxaborolane (Wako 325-41462, manufactured by Wako Chemical, Ltd.), and 0.07 mL of a toluene solution of calcium 2-ethylhexanoate (Ca content: 4.9%, Strem 93-2014, manufactured by Strem Chemicals Inc.) were blended, to thereby obtain a first passivation layer coating liquid. A first composite metal oxide formed with the first passivation layer coating liquid had the composition as depicted in Table 1-3.

—Production of Second Passivation Layer Coating Liquid—

In 1 mL of toluene, 0.99 mL of a toluene solution of lanthanum 2-ethylhexanoate (La content: 7%, Wako 122-033371, manufactured by Wako Chemical, Ltd.), 0.08 mL of a toluene solution of strontium 2-ethylhexanoate (Sr content: 2%, Wako 195-09561, manufactured by Wako Chemical, Ltd.), 0.03 mL of a toluene solution of barium 2-ethylhexanoate (Ba content: 8%, Wako 021-09471, manufactured by Wako Chemical, Ltd.), 0.03 mL of a mineral sprits solution of zirconium oxide 2-ethylhexanoate (Zr content: 12%, Wako 269-01116, manufactured by Wako Chemical, Ltd.), and 0.02 mL of a 2-ethylhexanoic acid solution of hafnium 2-ethylhexanoate (Gelest AKH332, manufactured by Gelest, Inc.) were blended, to thereby obtain a second passivation layer coating liquid. A second composite metal oxide formed with the second passivation layer coating liquid had the composition as depicted in Table 1-3.

A field-effect transistor was produced in the same manner as in Example 1, provided that the first passivation layer coating liquid, and second passivation layer coating liquid produced above were used.

Example 16

Production of Field-Effect Transistor

—Production of First Passivation Layer Coating Liquid—

In 1 mL of toluene, 0.11 mL of HMDS (1,1,1,3,3,3-hexamethyldisilazane, manufactured by TOKYO OHKA KOGYO CO., LTD.), 0.10 mL of aluminum di(s-butoxide) acetoacetate chelate (Al content: 8.4%, Alfa89349, manufactured by Alfa Aesar), 0.11 g of (4,4,5,5-tetramethyl-1,3,2-dioxaborolan-2-yl)benzene (Wako 325-59912, manufactured by Wako Chemical, Ltd.), 0.09 mL of a 2-ethylhexanoic acid solution of calcium 2-ethylhexanoate (Ca content: 3% to 8%, Alfa36657, manufactured by Alfa Aesar), and 0.17 mL of a toluene solution of strontium 2-ethylhexanoate (Sr content: 2%, Wako 195-09561, manufactured by Wako Chemical, Ltd.) were blended, to thereby obtain a first passivation layer coating liquid. A first composite metal oxide formed with the first passivation layer coating liquid had the composition as depicted in Table 1-3.

—Production of Second Passivation Layer Coating Liquid—

In 1 mL of toluene, 0.99 mL of a toluene solution of lanthanum 2-ethylhexanoate (La content: 7%, Wako 122-03371, manufactured by Wako Chemical, Ltd.), 0.27 mL of a toluene solution of strontium 2-ethylhexanoate (Sr content: 2%, Wako 195-09561, manufactured by Wako Chemical, Ltd.), and 0.05 mL of a mineral sprits solution of zirconium oxide 2-ethylhexanoate (Zr content: 12%, Wako 269-01116, manufactured by Wako Chemical, Ltd.) were blended, to thereby obtain a second passivation layer coating liquid. A second composite metal oxide formed with the second passivation layer coating liquid had the composition as depicted in Table 1-3.

A field-effect transistor was produced in the same manner as in Example 1, provided that the first passivation layer coating liquid, and second passivation layer coating liquid produced above were used.

Comparative Example 1

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.) was blended, to thereby obtain a first passivation layer coating liquid. A first metal oxide formed with the first passivation layer coating liquid had the composition as depicted in Table 2-1.

A field-effect transistor was produced in the same manner as in Example 1, provided that the first passivation layer coating liquid produced above was used, and the second passivation layer coating liquid was not used.

Comparative Example 2

Production of Field-Effect Transistor

—Production of Second Passivation Layer Coating Liquid—

In 1 mL of toluene, 0.99 mL of a toluene solution of lanthanum 2-ethylhexanoate (La content: 7%, Wako 122-033371, manufactured by Wako Chemical, Ltd.) was blended, to thereby obtain a second passivation layer coating liquid. A second metal oxide formed with the second passivation layer coating liquid had the composition as depicted in Table 2-1.

A field-effect transistor was produced in the same manner as in Example 1, provided that the second passivation layer coating liquid produced above was used, and the first passivation layer coating liquid was not used.

Comparative Example 3

Production of Field-Effect Transistor

—Production of Second Passivation Layer Coating Liquid—

In 1 mL of toluene, 0.43 mL of a toluene solution of magnesium 2-ethylhexanoate (Mg content: 3%, Strem 12-1260, manufactured by Strem Chemicals Inc.) was blended, to thereby obtain a second passivation layer coating liquid. A second metal oxide formed with the second passivation layer coating liquid had the composition as depicted in Table 2-1.

A field-effect transistor was produced in the same manner as in Example 1, provided that the second passivation layer coating liquid produced above was used, and the first passivation layer coating liquid was not used.

Comparative Example 4

Production of Field-Effect Transistor

—Production of First Passivation Layer Coating Liquid—

In 1 mL of toluene, 0.10 mL of HMDS (1,1,1,3,3,3-hexamethyldisilazane, manufactured by TOKYO OHKA KOGYO CO., LTD.) was blended, to thereby obtain a first passivation layer coating liquid. A first metal oxide formed with the first passivation layer coating liquid had the composition as depicted in Table 2-1.

—Production of Second Passivation Layer Coating Liquid—

In 1 mL of toluene, 0.59 g of scandium(III) tris(2,2,6,6-tetramethyl-3,5-heptanedionate)hydrate (Sigma-Aldrich 517607, manufactured by Sigma-Aldrich Co., LLC.) was blended, to thereby obtain a second passivation layer coating liquid. A second metal oxide formed with the second passivation layer coating liquid had the composition as depicted in Table 2-1.

A field-effect transistor was produced in the same manner as in Example 1, provided that the first passivation layer coating liquid, and second passivation layer coating liquid produced above were used.

Comparative Example 5

Production of Field-Effect Transistor

—Production of First Passivation Layer Coating Liquid—

In 1 mL of toluene, 0.11 mL of HMDS (1,1,1,3,3,3-hexamethyldisilazane, manufactured by TOKYO OHKA KOGYO CO., LTD.), and 2.57 mL of a toluene solution of barium 2-ethylhexanoate (Ba content: 8% by weight, Wako 021-09471, manufactured by Wako Chemical, Ltd.) were blended, to thereby obtain a first passivation layer coating liquid. A first composite metal oxide formed with the first passivation layer coating liquid had the composition as depicted in Table 2-1.

A field-effect transistor was produced in the same manner as in Example 1, provided that the first passivation layer coating liquid produced above was used, and the second passivation layer coating liquid was not used.

Comparative Example 6

Production of Field-Effect Transistor

—Production of Second Passivation Layer Coating Liquid—

In 1 mL of toluene, 0.31 mL of a toluene solution of gadolinium 2-ethylhexanoate (Gd content: 25% by weight, Strem 64-3500, manufactured by Strem Chemicals Inc.), and 0.23 mL of a toluene solution of barium 2-ethylhexanoate (Ba content: 8% by weight, Wako 021-09471, manufactured by Wako Chemical, Ltd.) were blended, to thereby obtain a second passivation layer coating liquid. A second composite metal oxide formed with the second passivation layer coating liquid had the composition as depicted in Table 2-2.

A field-effect transistor was produced in the same manner as in Example 1, provided that the second passivation layer coating liquid produced was used, and the first passivation layer coating liquid was not used.

Comparative Example 7

Production of Field-Effect Transistor

—Production of First Passivation Layer Coating Liquid—

In 1 mL of toluene, 0.11 mL of HMDS (1,1,1,3,3,3-hexamethyldisilazane, manufactured by TOKYO OHKA KOGYO CO., LTD.) was blended, to thereby obtain a first passivation layer coating liquid. A first metal oxide formed with the first passivation layer coating liquid had the composition as depicted in Table 2-2.

—Production of Second Passivation Layer Coating Liquid—

In 1 mL of toluene, 0.22 g of samarium acetylacetonate trihydrate (Strem 93-6226, manufactured by Strem Chemicals Inc.), and 0.36 mL of a toluene solution of strontium 2-ethylhexanoate (Sr content: 2% by weight, Wako 195-09561, manufactured by Wako Chemical, Ltd.) were blended, to thereby obtain a second passivation layer coating liquid. A second composite metal oxide formed with the second passivation layer coating liquid had the composition as depicted in Table 2-2.

A field-effect transistor was produced in the same manner as in Example 1, provided that the first passivation layer coating liquid, and second passivation layer coating liquid produced above were used.

Comparative Example 8

Production of Field-Effect Transistor

First, a gate electrode, a gate insulating layer, a source electrode and drain electrode, and an oxide semiconductor layer were formed on a glass substrate in the same manner as in Example 1.

—Formation of Passivation Layer—

As a passivation layer, a $SiO_2$ layer was formed using $SiCl_4$ as a raw material by plasma enhanced chemical vapor deposition (PECVD). The average film thickness of the passivation layer formed in the aforementioned manner was about 200 nm.

—Formation of Interlayer Insulating Layer—

Finally, an interlayer insulating layer was formed on the passivation layer in the same manner as in Example 1, to thereby complete a field-effect transistor.

TABLE 1-1

| | Oxide | Ex. 1 Molar ratio of oxide mol % | Ex. 2 Molar ratio of oxide mol % | Ex. 3 Molar ratio of oxide mol % | Ex. 4 Molar ratio of oxide mol % | Ex. 5 Molar ratio of oxide mol % |
|---|---|---|---|---|---|---|
| First composite metal oxide | $SiO_2$ | 80.0 | 70.3 | 75.5 | 84.2 | 83.3 |
| | $Al_2O_3$ | | | | | |
| | $B_2O_3$ | | | | | |
| | MgO | | 29.7 | | | 9.4 |
| | CaO | 10.5 | | 12.0 | 15.8 | |
| | SrO | 9.5 | | 7.5 | | 7.3 |
| | BaO | | | 5.0 | | |
| | Total | 100.0 | 100.0 | 100.0 | 100.0 | 100.0 |
| Second composite metal oxide | $Sc_2O_3$ | | | | 24.5 | |
| | $Y_2O_3$ | | 60.3 | | 40.5 | |
| | $La_2O_3$ | 80.0 | | | | |
| | $Nd_2O_3$ | | | | | |
| | $Sm_2O_3$ | | | | | 59.4 |
| | $Eu_2O_3$ | | | 48.2 | | |
| | $Gd_2O_3$ | | | 10.2 | | 10.0 |
| | $Dy_2O_3$ | | | | | |
| | $Yb_2O_3$ | | | | | |
| | MgO | | | 51.8 | | |
| | CaO | | 15.0 | | 18.5 | 12.3 |
| | SrO | 20.0 | 12.0 | | | |
| | BaO | | 12.7 | | 11.9 | 12.7 |
| | $ZrO_2$ | | | | | |
| | $HfO_2$ | | | | | |
| | Total | 100.0 | 100.0 | 100.0 | 100.0 | 100.0 |

TABLE 1-2

| | Oxide | Ex. 6 Molar ratio of oxide mol % | Ex. 7 Molar ratio of oxide mol % | Ex. 8 Molar ratio of oxide mol % | Ex. 9 Molar ratio of oxide mol % | Ex. 10 Molar ratio of oxide mol % |
|---|---|---|---|---|---|---|
| First composite metal oxide | $SiO_2$ | 72.5 | 70.7 | 60.0 | 75.5 | 80.0 |
| | $Al_2O_3$ | 18.2 | | 10.0 | | |
| | $B_2O_3$ | | 18.1 | 10.0 | | |
| | MgO | 4.3 | 7.1 | | | 5.3 |
| | CaO | | | 20.0 | | 9.7 |
| | SrO | | 4.1 | | 24.5 | |
| | BaO | 5.0 | | | | 5.0 |
| | Total | 100.0 | 100.0 | 100.0 | 100.0 | 100.0 |
| Second composite metal oxide | $Sc_2O_3$ | | | | | |
| | $Y_2O_3$ | | | | | |
| | $La_2O_3$ | | | 66.6 | | |
| | $Nd_2O_3$ | 40.0 | | | | |
| | $Sm_2O_3$ | | | | 72.5 | |
| | $Eu_2O_3$ | | 77.2 | | | |
| | $Gd_2O_3$ | | | | | 55.2 |
| | $Dy_2O_3$ | | | | | |
| | $Yb_2O_3$ | | | 8.3 | | |
| | MgO | | | | | |
| | CaO | 60.0 | | | 5.3 | 14.3 |
| | SrO | | 8.9 | 8.3 | 12.2 | |
| | BaO | | 13.9 | 16.8 | | |
| | $ZrO_2$ | | | | 10.0 | |
| | $HfO_2$ | | | | | 30.5 |
| | Total | 100.0 | 100.0 | 100.0 | 100.0 | 100.0 |

TABLE 1-3

| | Oxide | Ex. 11 Molar ratio of oxide mol % | Ex. 12 Molar ratio of oxide mol % | Ex. 13 Molar ratio of oxide mol % | Ex. 14 Molar ratio of oxide mol % | Ex. 15 Molar ratio of oxide mol % | Ex. 16 Molar ratio of oxide mol % |
|---|---|---|---|---|---|---|---|
| First composite metal oxide | $SiO_2$ | 87.9 | 67.5 | 75.0 | 80.5 | 70.0 | 67.5 |
| | $Al_2O_3$ | | 10.7 | 9.8 | | 11.9 | 10.7 |
| | $B_2O_3$ | | 11.8 | | 10.2 | 12.3 | 11.8 |
| | MgO | | | | 5.1 | | |
| | CaO | 4.0 | 7.4 | | | 5.8 | 7.4 |
| | SrO | | 2.6 | | 4.2 | | 2.6 |
| | BaO | 8.1 | | 15.2 | | | |
| | Total | 100.0 | 100.0 | 100.0 | 100.0 | 100.0 | 100.0 |
| Second composite metal oxide | $Sc_2O_3$ | | | | 50.3 | | |
| | $Y_2O_3$ | 50.5 | | | | | |
| | $La_2O_3$ | | 66.6 | | | 70.0 | 66.6 |
| | $Nd_2O_3$ | | | | | | |
| | $Sm_2O_3$ | | | 85.5 | | | |
| | $Eu_2O_3$ | | | | | | |
| | $Gd_2O_3$ | | | | | | |
| | $Dy_2O_3$ | 8.3 | | | | | |
| | $Yb_2O_3$ | | | | 10.5 | | |
| | MgO | 2.6 | | 9.2 | | | |

TABLE 1-3-continued

| Oxide | Ex. 11 Molar ratio of oxide mol % | Ex. 12 Molar ratio of oxide mol % | Ex. 13 Molar ratio of oxide mol % | Ex. 14 Molar ratio of oxide mol % | Ex. 15 Molar ratio of oxide mol % | Ex. 16 Molar ratio of oxide mol % |
|---|---|---|---|---|---|---|
| CaO | 3.6 | | | 10.5 | | |
| SrO | | 16.7 | | | 5.0 | 16.7 |
| BaO | | | | | 5.0 | |
| $ZrO_2$ | 20.3 | 16.7 | | 8.2 | 10.5 | 16.7 |
| $HfO_2$ | 14.7 | | 5.3 | 20.5 | 9.5 | |
| Total | 100.0 | 100.0 | 100.0 | 100.0 | 100.0 | 100.0 |

TABLE 2-1

| | Oxide | Comp. Ex. 1 Molar ratio of oxide mol % | Comp. Ex. 2 Molar ratio of oxide mol % | Comp. Ex. 3 Molar ratio of oxide mol % | Comp. Ex. 4 Molar ratio of oxide mol % | Comp. Ex. 5 Molar ratio of oxide mol % |
|---|---|---|---|---|---|---|
| First (composite) metal oxide | $SiO_2$ | 100.0 | | | 100.0 | 40.0 |
| | $Al_2O_3$ | | | | | |
| | $B_2O_3$ | | | | | |
| | MgO | | | | | |
| | CaO | | | | | |
| | SrO | | | | | |
| | BaO | | | | | 60.0 |
| | Total | 100.0 | 0 | 0 | 100.0 | 100.0 |
| Second (composite) metal oxide | $Sc_2O_3$ | | | | 100.0 | |
| | $Y_2O_3$ | | | | | |
| | $La_2O_3$ | | 100.0 | | | |
| | $Nd_2O_3$ | | | | | |
| | $Sm_2O_3$ | | | | | |
| | $Eu_2O_3$ | | | | | |
| | $Gd_2O_3$ | | | | | |
| | $Dy_2O_3$ | | | | | |
| | $Yb_2O_3$ | | | | | |
| | MgO | | | 100.0 | | |
| | CaO | | | | | |
| | $HfO_2$ | | | | | |
| | Total | 0 | 100.0 | 100.0 | 100.0 | 0 |

TABLE 2-2

| | Oxide | Comp. Ex. 6 Molar ratio of oxide mol % | Comp. Ex. 7 Molar ratio of oxide mol % | Comp. Ex. 8 Molar ratio of oxide mol % |
|---|---|---|---|---|
| First (composite) metal oxide | $SiO_2$ | 0 | 100.0 | 100.0 |
| | $Al_2O_3$ | | | |
| | $B_2O_3$ | | | |
| | MgO | | | |
| | CaO | | | |
| | SrO | | | |
| | BaO | | | |
| | Total | 0 | 100.0 | 100.0 |
| Second (composite) metal oxide | $Sc_2O_3$ | | | |
| | $Y_2O_3$ | | | |
| | $La_2O_3$ | | | |
| | $Nd_2O_3$ | | | |
| | $Sm_2O_3$ | | 75.4 | |
| | $Eu_2O_3$ | | | |
| | $Gd_2O_3$ | 65.0 | | |
| | $Dy_2O_3$ | | | |
| | $Yb_2O_3$ | | | |
| | MgO | | | |
| | CaO | | | |
| | SrO | 35.0 | 24.6 | |
| | BaO | | | |
| | $ZrO_2$ | | | |
| | $HfO_2$ | | | |
| | Total | 100.0 | 100.0 | 0 |

<Reliability Evaluation of Field-Effect Transistor>

A bias temperature stress (BTS) test was performed on each of the field-effect transistors produced in Examples 1 to 16, and Comparative Examples 1 to 8 in the atmospheric air (temperature: 50° C., relative humidity: 50%) for 400 hours. The stress conditions were the following 4 conditions.

(1) The voltage (Vgs) between the gate electrode 92 and the source electrode 94 was +20 V (Vgs=+20V), and the voltage (Vds) between the drain electrode 95 and the source electrode 94 was 0 V (Vds=0 V).
(2) Vgs=+20 V, and Vds=+20 V
(3) Vgs=−20 V, and Vds=0 V
(4) Vgs=−20 V, and Vds=+20 V As the BTS test passes a certain period of time, the relationship (Vgs–Ids) between Vgs and the electric current (Ids) between the source electrode 94 and the drain electrode 95 was measured with Vds=+20 V.

Figure 10:
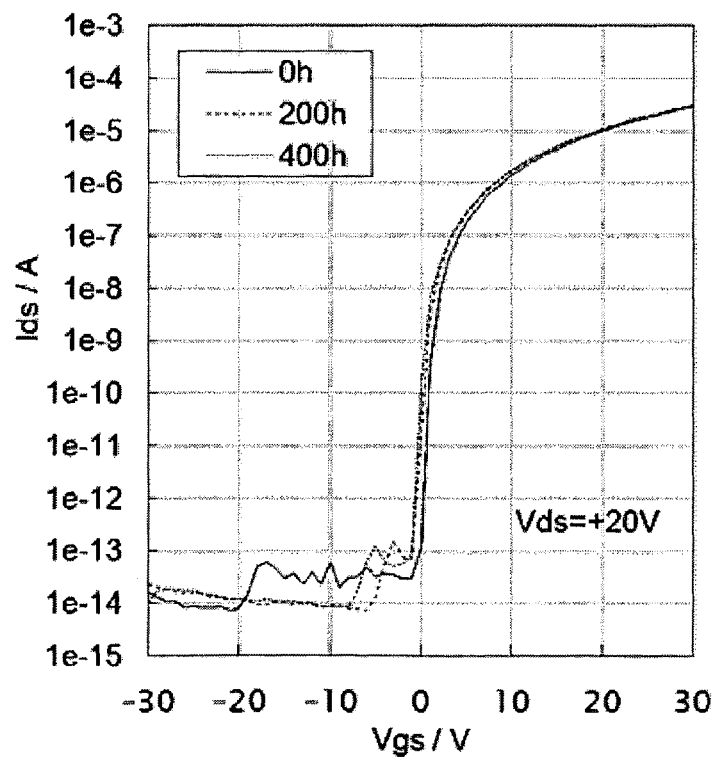
FIG. 10 is a graph evaluating transistor characteristics (Vgs–Ids) of the field-effect transistor obtained in Example 12 at the BTS test with Vgs=+20 V, and Vds=0 V.
Figure 11:
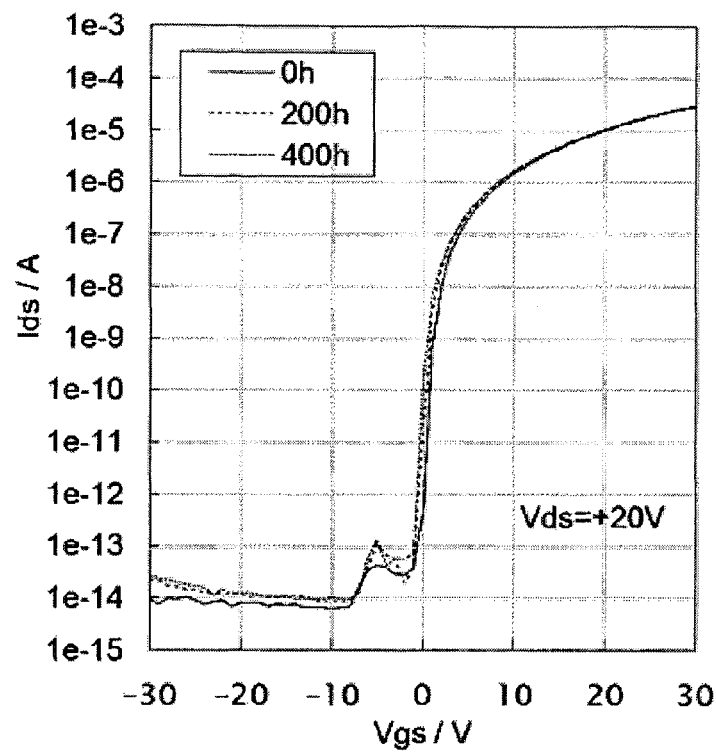
FIG. 11 is a graph evaluating transistor characteristics (Vgs–Ids) of the field-effect transistor obtained in Example 12 at the BTS test with Vgs=+20 V, and Vds=+20 V.
Figure 12:
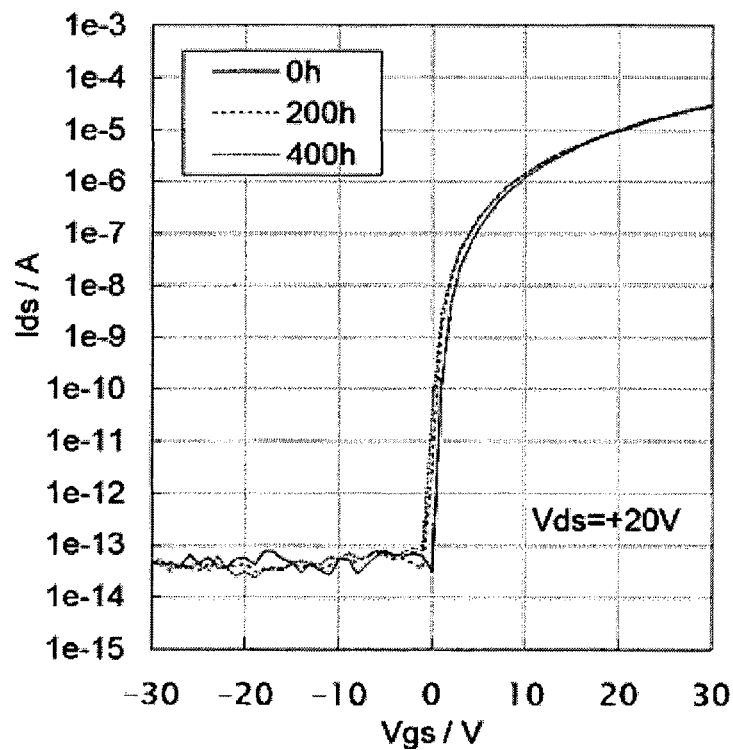
FIG. 12 is a graph evaluating transistor characteristics (Vgs–Ids) of the field-effect transistor obtained in Example 12 at the BTS test with Vgs=−20 V, and Vds=0 V.
Figure 13:
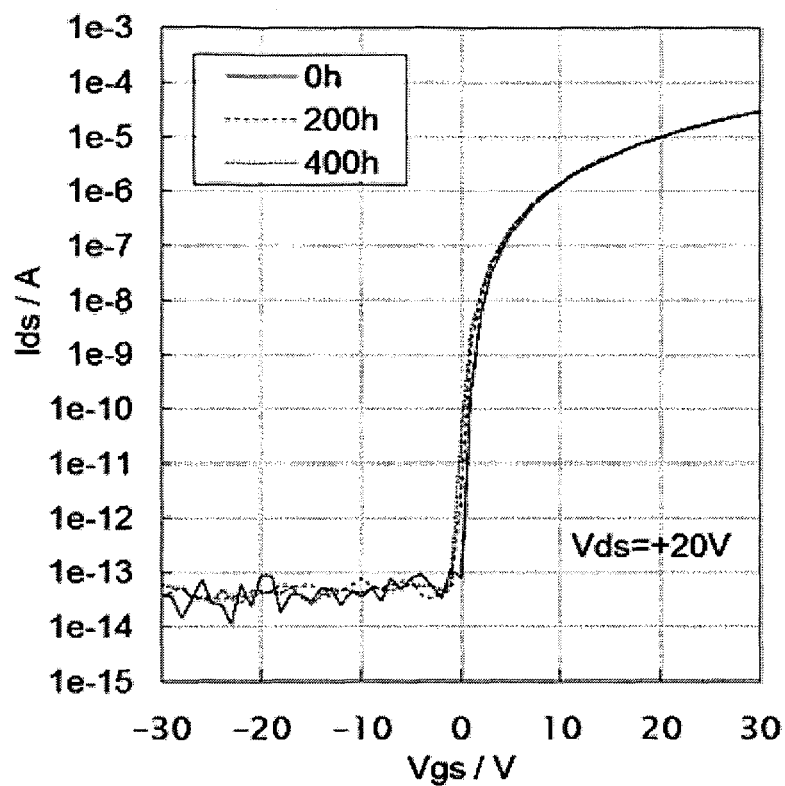
FIG. 13 is a graph evaluating transistor characteristics (Vgs–Ids) of the field-effect transistor obtained in Example 12 at the BTS test with Vgs=−20 V, and Vds=+20 V.

The result of Vgs–Ids in the test performed on the field-effect transistor produced in Example 12, where the stress conditions were Vgs=+20 V, and Vds=0 V, was depicted in FIG. 10. The result of Vgs–Ids in the test performed thereon, where the stress conditions were Vgs=+20 V, and Vds=+20 V, was depicted in FIG. 11. The result of Vgs–Ids in the test performed thereon, where the stress conditions were Vgs=−20 V, and Vds=0 V, was depicted in FIG. 12. The result of Vgs–Ids in the test performed thereon, where the stress conditions were Vgs=−20 V, and Vds=+20 V, was depicted in FIG. 13.

Figure 14:
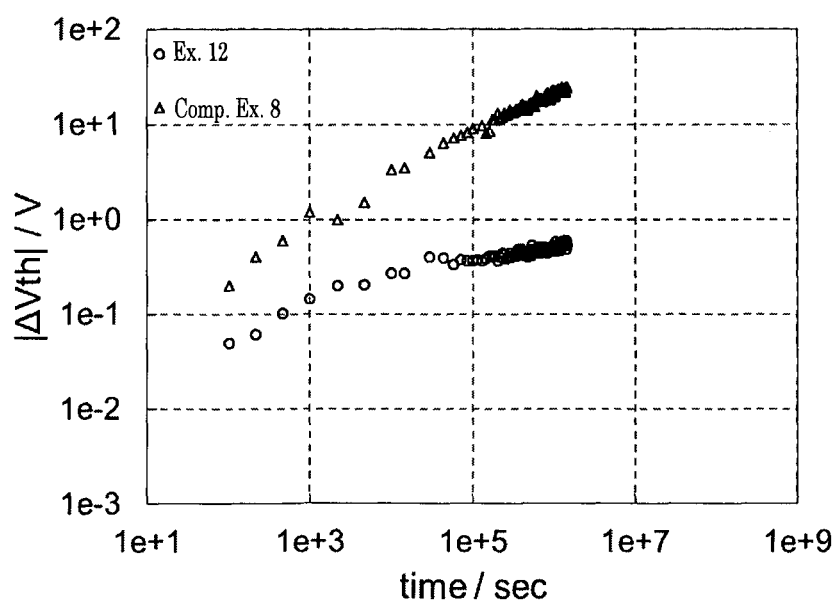
FIG. 14 is a graph evaluating chronological stress change of the field-effect transistors obtained in Example 12 and Comparative Example 8 at the BTS test with Vgs=+20 V, and Vds=0 V.

Here, "e" in the vertical axis in the graphs of FIGS. 10 to 13, and the horizontal axis and the vertical axis in the graph of FIG. 14 denotes "the exponent of 10." For example, "1e-03" denotes "$1 \times 10^{-3}$" and "0.001," and "1e-05" denotes "$1 \times 10^{-5}$" and "0.00001."

The variation value of the threshold voltage (ΔVth) against the stress time in the BTS test performed on each of the field-effect transistors produced in Example 12 and Comparative Example 8 under the stress conditions of Vgs=+20 V, and Vds=0 V was depicted in FIG. 14. Here, ΔVth denotes the varied value of Vth from 0 hours of the stress time to the certain period of the stress time. It could be confirmed in FIG. 14 that the field-effect transistor produced in Example 12 had a small shift in ΔVth, and exhibited excellent reliability. On the other hand, the field-effect transistor produced in Comparative Example 8 had a large shift in ΔVth, and reliability thereof was insufficient.

The value of ΔVth with the stress time of 400 hours in the BTS test performed on each of the field-effect transistors of Examples 1 to 16, and Comparative Examples 1 to 8 was depicted in Tables 3 and 4. It could be confirmed in Tables 3 and 4 that the field-effect transistors produced in Examples 1 to 16 each had a small shift in ΔVth, and exhibited excellent reliability against the BTS test. On the other hand, the field-effect transistors produced in Comparative Examples 1, 4, 5, 6, 7, and 8 each had a large shift in ΔVth, and reliability thereof was insufficient. Moreover, the field-effect transistors produced in Comparative Examples 2 and 3 could not maintain their transistor characteristics in the atmosphere, and therefore the BTS test could not be performed thereon.

TABLE 3

| | ΔVth in BTS test for 400 hours (stress conditions: Vgs = +20 V, Vds = 0 V) | ΔVth in BTS test for 400 hours (stress conditions: Vgs = +20 V, Vds = +20 V) |
|---|---|---|
| Ex. 1 | −0.95 V | −0.75 V |
| Ex. 2 | −0.84 V | −0.88 V |
| Ex. 3 | −0.99 V | −0.80 V |
| Ex. 4 | −0.85 V | −0.83 V |
| Ex. 5 | −0.90 V | −0.88 V |
| Ex. 6 | −0.78 V | −0.68 V |
| Ex. 7 | −0.87 V | −0.75 V |
| Ex. 8 | −0.73 V | −0.79 V |
| Ex. 9 | −0.60 V | −0.65 V |
| Ex. 10 | −0.81 V | −0.70 V |
| Ex. 11 | −0.74 V | −0.63 V |
| Ex. 12 | −0.53 V | −0.60 V |
| Ex. 13 | −0.65 V | −0.72 V |
| Ex. 14 | −0.76 V | −0.69 V |
| Ex. 15 | −0.72 V | −0.62 V |
| Ex. 16 | −0.55 V | −0.58 V |
| Comp. Ex. 1 | −29.55 V | −28.47 V |
| Comp. Ex. 2 | Impossible to measure in BTS test | |
| Comp. Ex. 3 | Impossible to measure in BTS test | |
| Comp. Ex. 4 | −27.96 V | −29.33 V |
| Comp. Ex. 5 | −24.39 V | −24.66 V |
| Comp. Ex. 6 | −23.29 V | −27.53 V |
| Comp. Ex. 7 | −25.35 V | −24.78 V |
| Comp. Ex. 8 | −24.65 V | −23.22 V |

TABLE 4

| | ΔVth in BTS test for 400 hours (stress conditions: Vgs = −20 V, Vds = 0 V) | ΔVth in BTS test for 400 hours (stress conditions: Vgs = −20 V, Vds = +20 V) |
|---|---|---|
| Ex. 1 | −0.86 V | −0.98 V |
| Ex. 2 | −0.88 V | −0.86 V |
| Ex. 3 | −0.93 V | −0.84 V |
| Ex. 4 | −0.92 V | −0.96 V |
| Ex. 5 | −0.83 V | −0.84 V |
| Ex. 6 | −0.69 V | −0.92 V |
| Ex. 7 | −0.75 V | −0.85 V |
| Ex. 8 | −0.75 V | −0.79 V |
| Ex. 9 | −0.74 V | −0.69 V |
| Ex. 10 | −0.80 V | −0.76 V |
| Ex. 11 | −0.62 V | −0.63 V |
| Ex. 12 | −0.63 V | −0.52 V |
| Ex. 13 | −0.73 V | −0.55 V |
| Ex. 14 | −0.62 V | −0.70 V |
| Ex. 15 | −0.63 V | −0.69 V |
| Ex. 16 | −0.54 V | −0.53 V |
| Comp. Ex. 1 | −27.54 V | −26.98 V |
| Comp. Ex. 2 | Impossible to measure in BTS test | |
| Comp. Ex. 3 | Impossible to measure in BTS test | |
| Comp. Ex. 4 | −28.98 V | −27.65 V |
| Comp. Ex. 5 | −23.21 V | −22.87 V |
| Comp. Ex. 6 | −24.68 V | −28.57 V |
| Comp. Ex. 7 | −23.58 V | −25.35 V |
| Comp. Ex. 8 | −25.59 V | −23.52 V |

The embodiments of the present invention are, for example, as follows:

<1> A field-effect transistor, containing:
a base;
a passivation layer;
a gate insulating layer formed between the base and the passivation layer;
a source electrode and a drain electrode, which are formed to be in contact with the gate insulating layer;
a semiconductor layer, which is formed between at least the source electrode and the drain electrode, and is in contact with the gate insulating layer, the source electrode, and the drain electrode; and
a gate electrode, which is in contact with the gate insulating layer, and faces the semiconductor layer via the gate insulating layer,
wherein the passivation layer contains a first passivation layer, which contains Si, and an alkaline earth metal, and a second passivation layer, which is formed to be in contact with the first passivation layer, and contains an alkaline earth metal, and a rare-earth element.

<2> The field-effect transistor according to <1>, wherein the first composite metal oxide further contains Al, or B, or both thereof.

<3> The field-effect transistor according to <1> or <2>, wherein the second composite metal oxide further contains Zr, or Hf, or both thereof.

<4> The field-effect transistor according to any one of <1> to <3>, wherein the semiconductor layer is an oxide semiconductor.

<5> A display element, containing:
a light control element configured to control light output according to a driving signal; and
a driving circuit containing the field-effect transistor according to any one of <1> to <4>, which is configured to drive the light control element.

<6> The display element according to <5>, wherein the light control element contains an electroluminescent element, an electrochromic element, a liquid crystal element, an electrophoretic element, or an electrowetting element.
<7> An image display device, which displays an image corresponding to image data, the device containing:
a plurality of the display element according to <5> or <6>, arranged in a matrix;
a plurality of lines configured to separately apply gate voltage to field-effect transistors in each of the display elements; and
a display control device configured to individually control the gate voltage of each of the field-effect transistors through the lines corresponding to the image data.
<8> A system, containing:
the image display device according to <7>; and
an image data generating device configured to generate an image data based on an image information to be displayed, and to output the generated image data to the image display device.

REFERENCE SIGNS LIST 11 field-effect transistor
12 field-effect transistor
13 capacitor
14 field-effect transistor
15 capacitor
16 counter electrode
21 base
22 gate electrode
23 gate insulating layer
24 source electrode
25 drain electrode
26 oxide semiconductor layer
27a passivation layer (I)
27b passivation layer (II)
31 base
32 gate electrode (I)
33 gate electrode (II)
34 gate insulating layer
35 source electrode (I)
36 source electrode (II)
37 drain electrode (I)
38 drain electrode (II)
39 semiconductor layer (I)
40 semiconductor layer (II)
41a passivation layer (I-1)
41b passivation layer (I-2)
42a passivation layer (II-1)
42b passivation layer (II-2)
43 interlayer insulating layer
44 organic EL layer
45 cathode
91 base
92 gate electrode
93 gate insulating layer
94 source electrode
95 drain electrode
96 oxide semiconductor layer
97a first passivation layer
97b second passivation layer
98 interlayer insulating layer
302, 302' display element
310 display
312 cathode
314 anode
320, 320' driving circuit (driving circuit)
340 organic EL thin film layer
342 electron transporting layer
344 light emitting layer
346 hole transporting layer
350 organic EL element
370 liquid crystal element
372 counter electrode
400 display control device
402 image data processing circuit
404 scanning line driving circuit
406 data line driving circuit

The invention claimed is:

1. A field-effect transistor, comprising:
a base;
a passivation layer including
a first passivation layer which contains a first oxide containing Si (silicon) and an alkaline earth metal, and
a second passivation layer which contains a second oxide containing an alkaline earth metal and a rare-earth element;
a gate insulating layer formed between the base and the passivation layer;
a source electrode and a drain electrode, which are formed to be in contact with the gate insulating layer;
a semiconductor layer, which is formed between at least the source electrode and the drain electrode, and is in contact with the gate insulating layer, the source electrode, and the drain electrode; and
a gate electrode, which is in contact with the gate insulating layer, and faces the semiconductor layer via the gate insulating layer,
wherein the first passivation layer includes a first surface and a second surface opposite to said first surface of the first passivation layer, and the second passivation layer includes a first surface and a second surface opposite to said first surface of the second passivation layer, and
wherein (a) the second surface of the first passivation layer, which contains the first oxide containing Si (silicon) and the alkaline earth metal, contacts and covers the first surface of the second passivation layer, which contains the second oxide containing the alkaline earth metal and the rare-earth element, or (b) the second surface of the second passivation layer contacts and covers the first surface of the first passivation layer.

2. The field-effect transistor according to claim 1, wherein the first oxide further contains Al (aluminum), or B (boron), or both thereof.

3. The field-effect transistor according to claim 1, wherein the second oxide further contains Zr (zirconium), or Hf (hafnium), or both thereof.

4. The field-effect transistor according to claim 1, wherein the semiconductor layer is an oxide semiconductor.

5. A display element, comprising:
a light control element configured to control light output according to a driving signal; and
a driving circuit containing the field-effect transistor according to claim 1, which is configured to drive the light control element.

6. The display element according to claim 5, wherein the light control element contains an electroluminescent element, an electrochromic element, a liquid crystal element, an electrophoretic element, or an electrowetting element.

7. An image display device, which displays an image corresponding to image data, the image display device comprising:

a plurality of display elements each constituted like the display element according to claim 5, the plurality of display elements being arranged in a matrix;

a plurality of lines configured to separately apply gate voltage to field-effect transistors in each of the display elements; and a display control device configured to individually control the gate voltage of each of the field-effect transistors through the lines corresponding to the image data.

8. A system, comprising:

the image display device according to claim 7; and an image data generating device configured to generate an image data based on an image information to be displayed, and to output the generated image data to the image display device.

9. The field-effect transistor according to claim 1, wherein the material of the first passivation layer is different than that of the second passivation layer.

* * * * *